(12) United States Patent
Sugawara et al.

(10) Patent No.: US 10,629,606 B2
(45) Date of Patent: Apr. 21, 2020

(54) THREE-DIMENSIONAL MEMORY DEVICE HAVING LEVEL-SHIFTED STAIRCASES AND METHOD OF MAKING THEREOF

(71) Applicant: SANDISK TECHNOLOGIES LLC, Plano, TX (US)

(72) Inventors: Nobutoshi Sugawara, Yokkaichi (JP); Shigeyuki Sugihara, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/805,599

(22) Filed: Nov. 7, 2017

(65) Prior Publication Data

US 2019/0139974 A1    May 9, 2019

(51) Int. Cl.
| | | |
|---|---|---|
| *H01L 27/11* | (2006.01) | |
| *H01L 27/11556* | (2017.01) | |
| *H01L 27/11582* | (2017.01) | |
| *H01L 21/8239* | (2006.01) | |
| *G11C 16/04* | (2006.01) | |

(Continued)

(52) U.S. Cl.
CPC .... *H01L 27/11556* (2013.01); *G11C 16/0441* (2013.01); *H01L 21/8239* (2013.01); *H01L 27/1157* (2013.01); *H01L 27/11575* (2013.01); *H01L 27/11582* (2013.01); *G11C 16/0483* (2013.01); *H01L 21/823487* (2013.01)

(58) Field of Classification Search
CPC .. H01L 27/11; H01L 27/11529; H01L 27/222; H01L 27/112; H01L 21/8221; H01L 27/11514; H01L 27/11507; H01L 27/11521; H01L 27/11524; H01L 27/11526; H01L 27/11531; H01L 27/11568; H01L 27/11578
See application file for complete search history.

(56) References Cited

U.S. PATENT DOCUMENTS

| | | |
|---|---|---|
| 5,915,167 A | 6/1999 | Leedy |
| 7,952,136 B2 | 5/2011 | Kito et al. |

(Continued)

FOREIGN PATENT DOCUMENTS

| | | |
|---|---|---|
| KR | 20100109745 A | 10/2010 |
| KR | 20110021444 A | 3/2011 |

OTHER PUBLICATIONS

Norizuki, N. et al., "Three-Dimensional Memory Device with Level-Shifted Staircase Structures and Method of Making Thereof," U.S. Appl. No. 15/451,773, filed Mar. 7, 2017, 121 pages.

(Continued)

*Primary Examiner* — Moin M Rahman
(74) *Attorney, Agent, or Firm* — The Marbury Law Group, PLLC

(57) ABSTRACT

A plurality of horizontal top surfaces that are vertically offset is formed on a substrate. An alternating stack of insulating layers and spacer material layers is formed and patterned to provide a plurality of staircase regions that are laterally spaced apart and overlies a respective one of the plurality of horizontal top surfaces of the substrate. Memory stack structures are formed through the alternating stack. The spacer material layers are formed as, or are replaced with, electrically conductive layers. A set of contact via cavities are formed over the electrically conductive layers.

8 Claims, 38 Drawing Sheets

(51) Int. Cl.
*H01L 27/11575* (2017.01)
*H01L 27/1157* (2017.01)
*H01L 21/8234* (2006.01)

(56) References Cited

U.S. PATENT DOCUMENTS

| | | | |
|---|---|---|---|
| 8,187,932 | B2 | 5/2012 | Nguyen et al. |
| 8,284,601 | B2 | 10/2012 | Son et al. |
| 8,394,716 | B2 | 3/2013 | Hwang et al. |
| 8,520,425 | B2 | 8/2013 | Xiao et al. |
| 8,884,357 | B2 | 11/2014 | Wang et al. |
| 8,946,023 | B2 | 2/2015 | Makala et al. |
| 9,230,987 | B2 | 1/2016 | Pachamuthu et al. |
| 9,449,987 | B1* | 9/2016 | Miyata .............. H01L 27/11582 |
| 9,583,539 | B2 | 2/2017 | Takaki |
| 2008/0149913 | A1 | 6/2008 | Tanaka et al. |
| 2009/0230449 | A1 | 9/2009 | Sakaguchi et al. |
| 2010/0090188 | A1 | 4/2010 | Futatsuyama |
| 2010/0254191 | A1 | 10/2010 | Son et al. |
| 2012/0195128 | A1 | 8/2012 | Fujiwara et al. |
| 2012/0256247 | A1 | 10/2012 | Alsmeier |
| 2013/0270714 | A1 | 10/2013 | Lee et al. |
| 2015/0179577 | A1 | 6/2015 | Tobitsuka et al. |
| 2015/0179659 | A1 | 6/2015 | Takaki et al. |
| 2015/0179662 | A1* | 6/2015 | Makala .............. H01L 27/11578 257/314 |
| 2015/0325587 | A1* | 11/2015 | Chen ................. H01L 27/11582 257/314 |
| 2016/0204117 | A1 | 7/2016 | Liu et al. |
| 2016/0358855 | A1* | 12/2016 | Oh ...................... H01L 23/5226 |

OTHER PUBLICATIONS

Endoh et al., "Novel Ultra High Density Memory with a Stacked-Surrounding Gate Transistor (S-SGT) Structured Cell," IEDM Proc. (2001) 33-36.

Invitation to Pay Additional Fees and Search Report from the European Patent Office received in connection with International Application No. PCT/US2014/071397; dated Mar. 26, 2015.

International Search Report for PCT/US2014/071397, dated Mar. 18, 2015 (5 pages).

Written Opinion of the International Searching Authority for PCT/US2014/071397, dated Mar. 18, 2015 (11 pages).

International Preliminary Report on Patentability for International Application No. PCT/US2014/071397, 12 pages, dated Jun. 21, 2016.

Non-Final Office Action for corresponding U.S. Appl. No. 14/643,211, filed Mar. 10, 2015, dated Apr. 4, 2016, containing 22 pages.

U.S. Appl. No. 15/251,374, filed Aug. 30, 2016, SanDisk Technologies LLC.

U.S. Appl. No. 15/367,791, filed Dec. 2, 2016, SanDisk Technologies LLC.

* cited by examiner

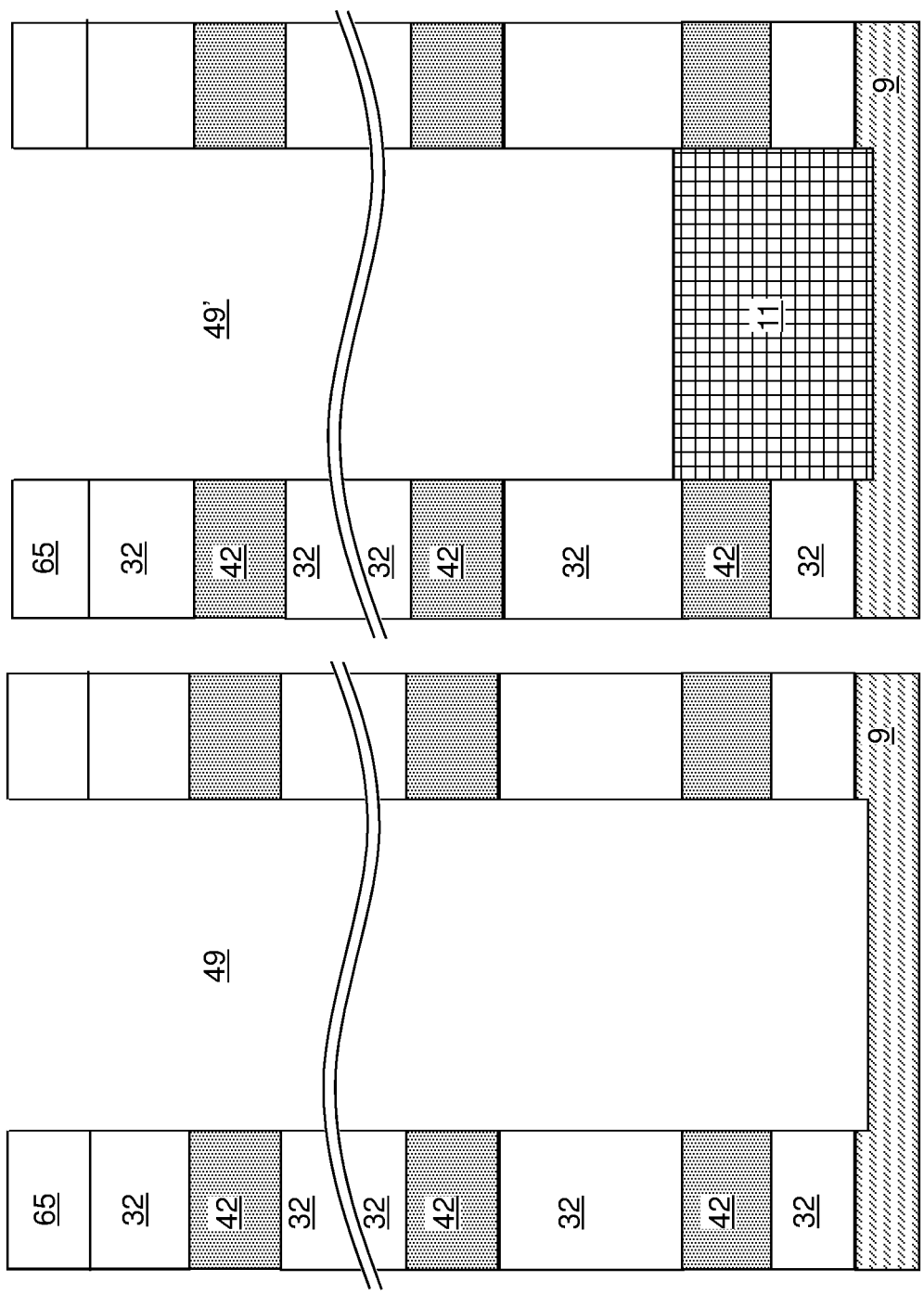

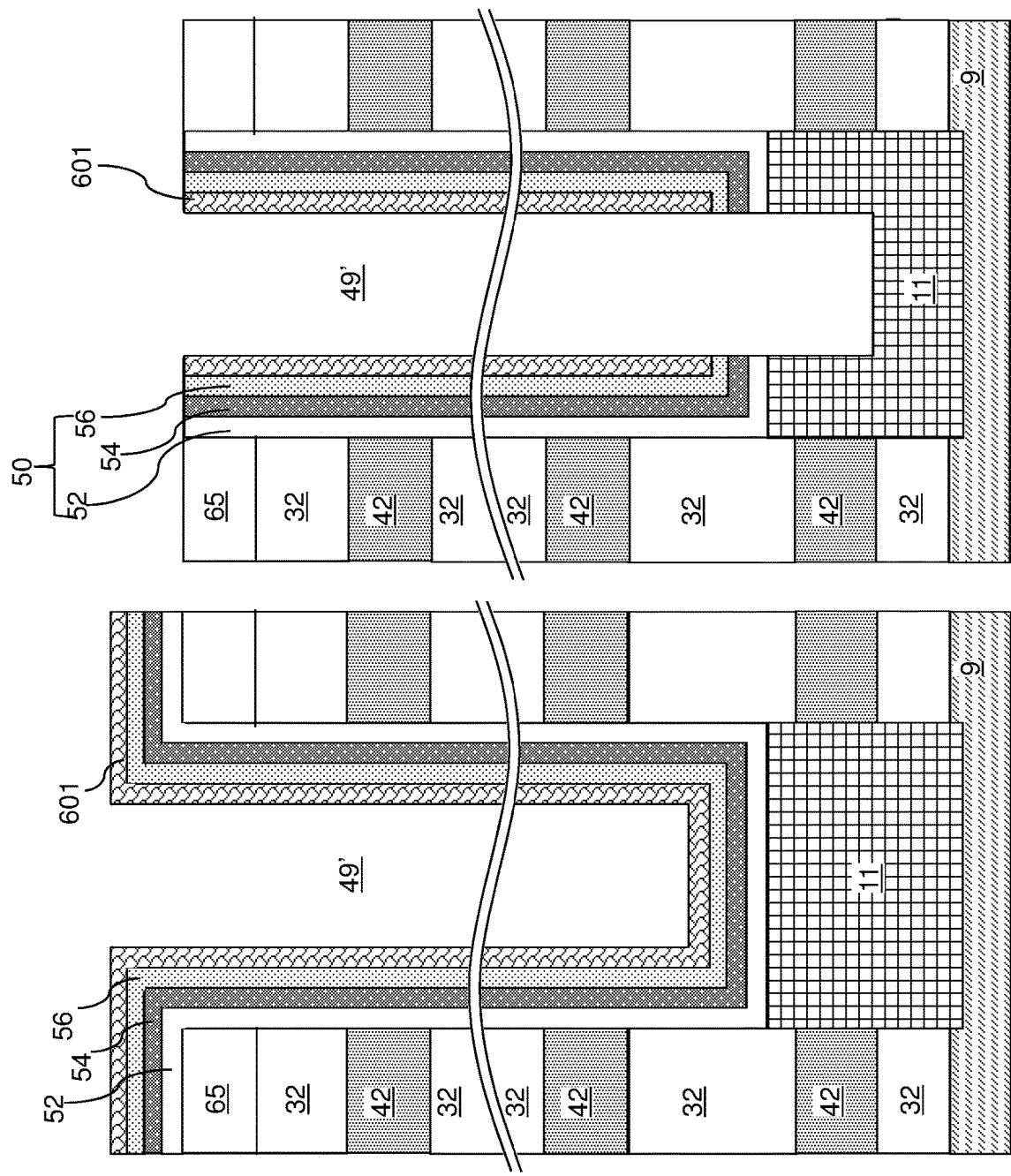

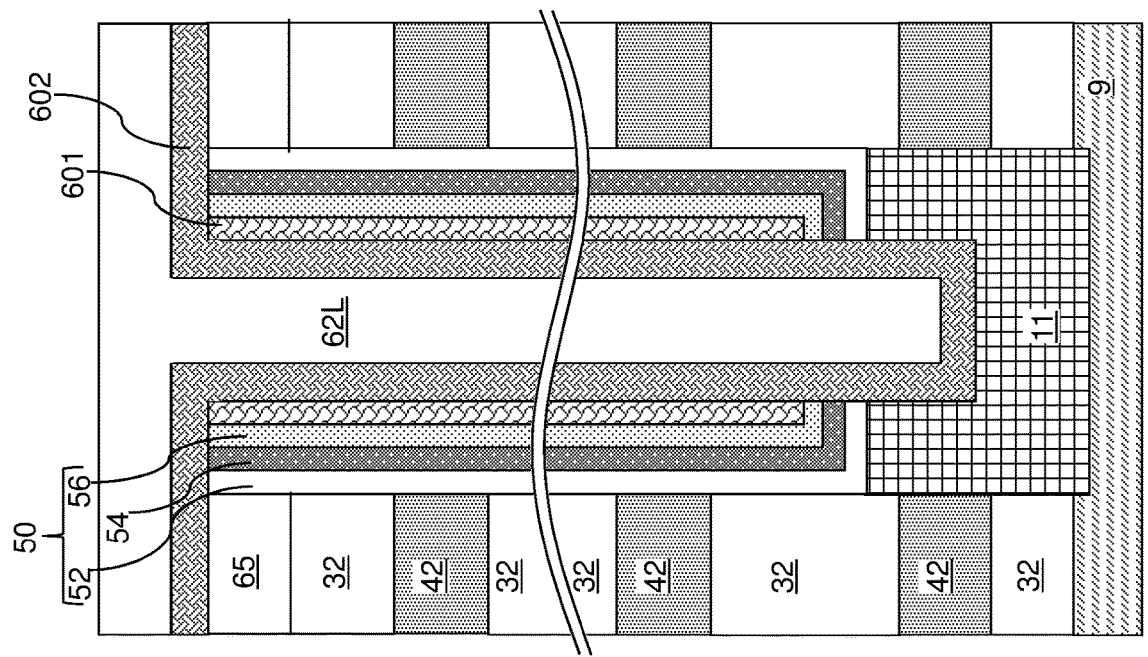
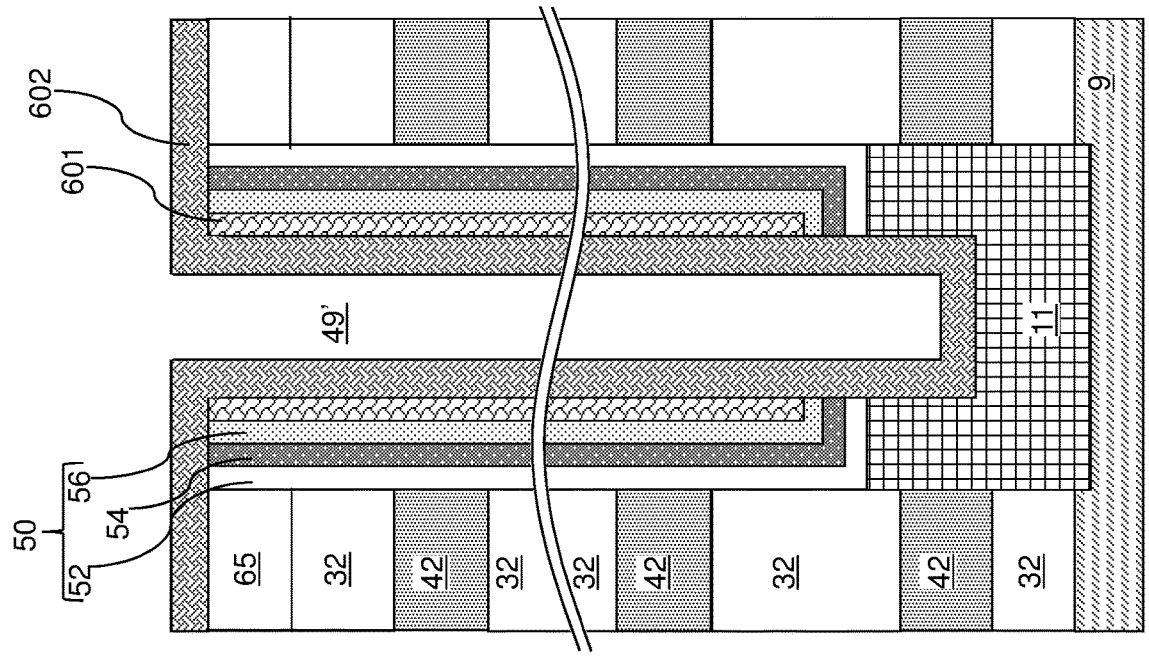

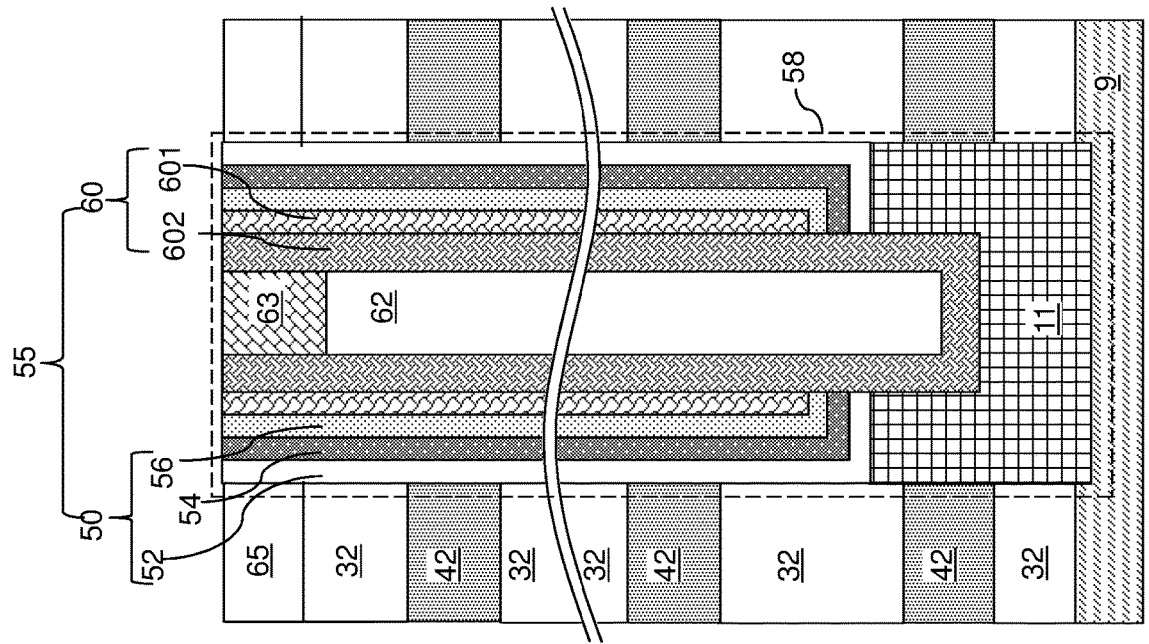
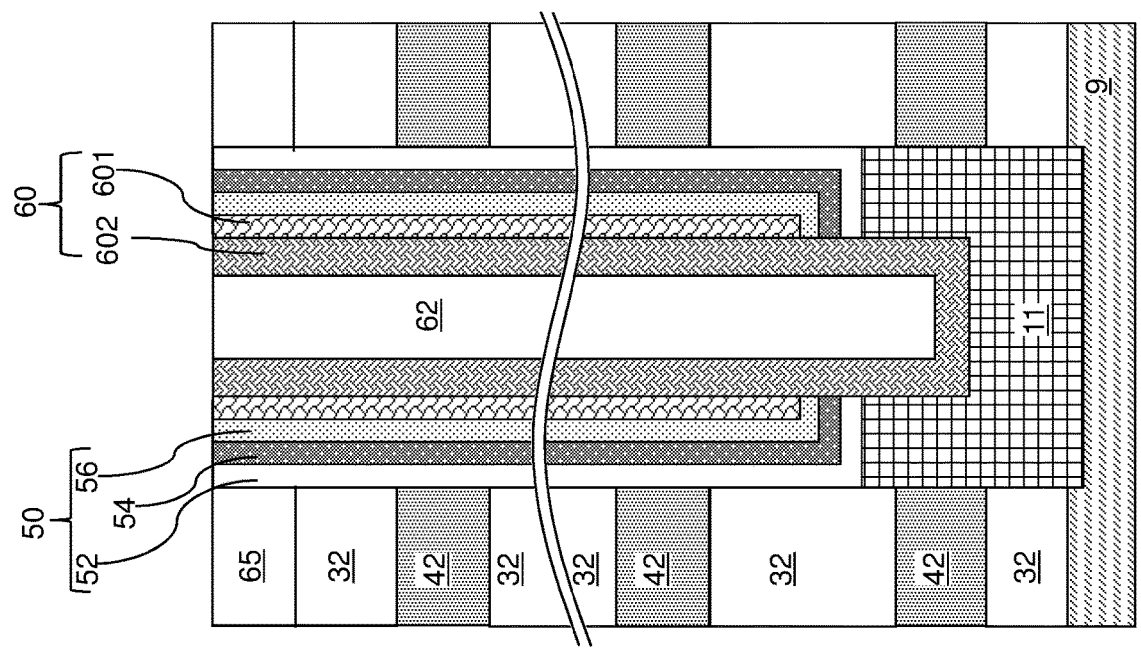

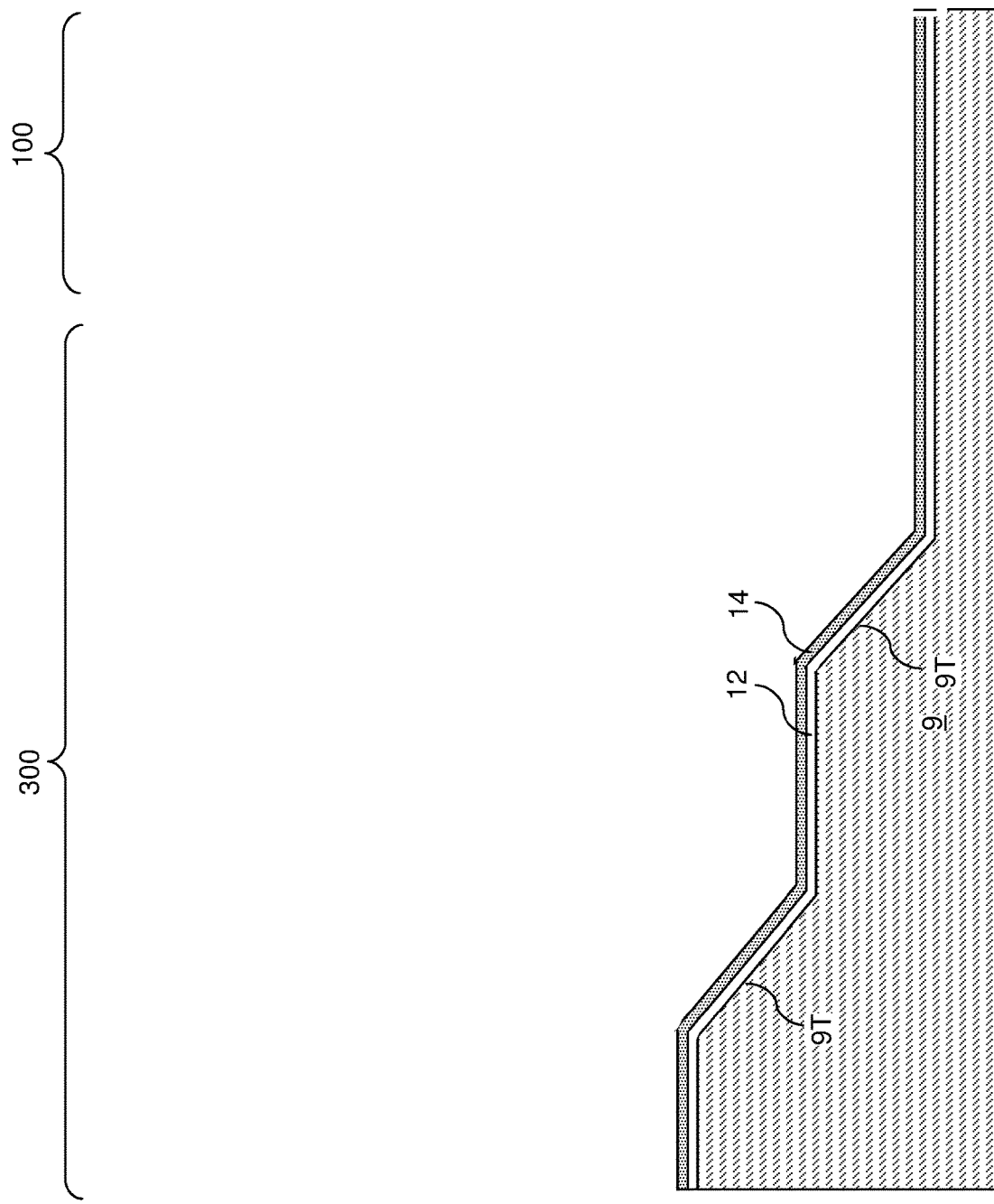

THREE-DIMENSIONAL MEMORY DEVICE HAVING LEVEL-SHIFTED STAIRCASES AND METHOD OF MAKING THEREOF

FIELD

The present disclosure relates generally to the field of semiconductor devices, and particular to a three-dimensional memory device employing level-shifted staircases for reducing height variations of contact via structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a substrate including a plurality of vertically separated horizontal top surfaces, wherein the plurality of top surfaces includes a memory array region horizontal top surface that is located in a memory array region and is more proximal to a back side surface of the substrate than any other of the plurality of horizontal top surfaces located in a contact region; an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface; and memory stack structures extending through the alternating stack and located in the memory array region, wherein each of the memory stack structures comprises a memory film and a vertical semiconductor channel located within the memory film.

According to another aspect of the present disclosure, a method of forming a three-dimensional memory device is provided, which comprises: forming a plurality of vertically offset horizontal top surfaces on a substrate, wherein the plurality of top surfaces includes a memory array region horizontal top surface that is formed in a memory array region and is more proximal to a back side surface of the substrate than any other of the plurality of horizontal top surfaces; forming an alternating stack of insulating layers and spacer material layers over the plurality of horizontal top surfaces, wherein the spacer material layers are formed as, or are replaced with, electrically conductive layers; forming a plurality of staircase regions by patterning the alternating stack, wherein each of the plurality of staircase regions is formed over a respective one of the plurality of horizontal top surfaces, and a respective subset of the spacer material layers within each of the plurality of staircase regions has a lateral extent that decreases with a vertical distance from the back side surface; and forming memory stack structures through the alternating stack in the memory array region, wherein each of the memory stack structures comprises a memory film and a vertical semiconductor channel located within the memory film.

BRIEF DESCRIPTION OF THE DRAWINGS

FIGS. 15A-15H are sequential schematic vertical cross-sectional views of a memory opening within the first exemplary structure during formation of a memory opening fill structure therein according to the first embodiment of the present disclosure.

FIG. 22 is a schematic vertical cross-sectional view of a second exemplary structure after formation of a pad silicon oxide layer and an oxygen diffusion barrier layer according to a second embodiment of the present disclosure.

DETAILED DESCRIPTION

Figure 1:
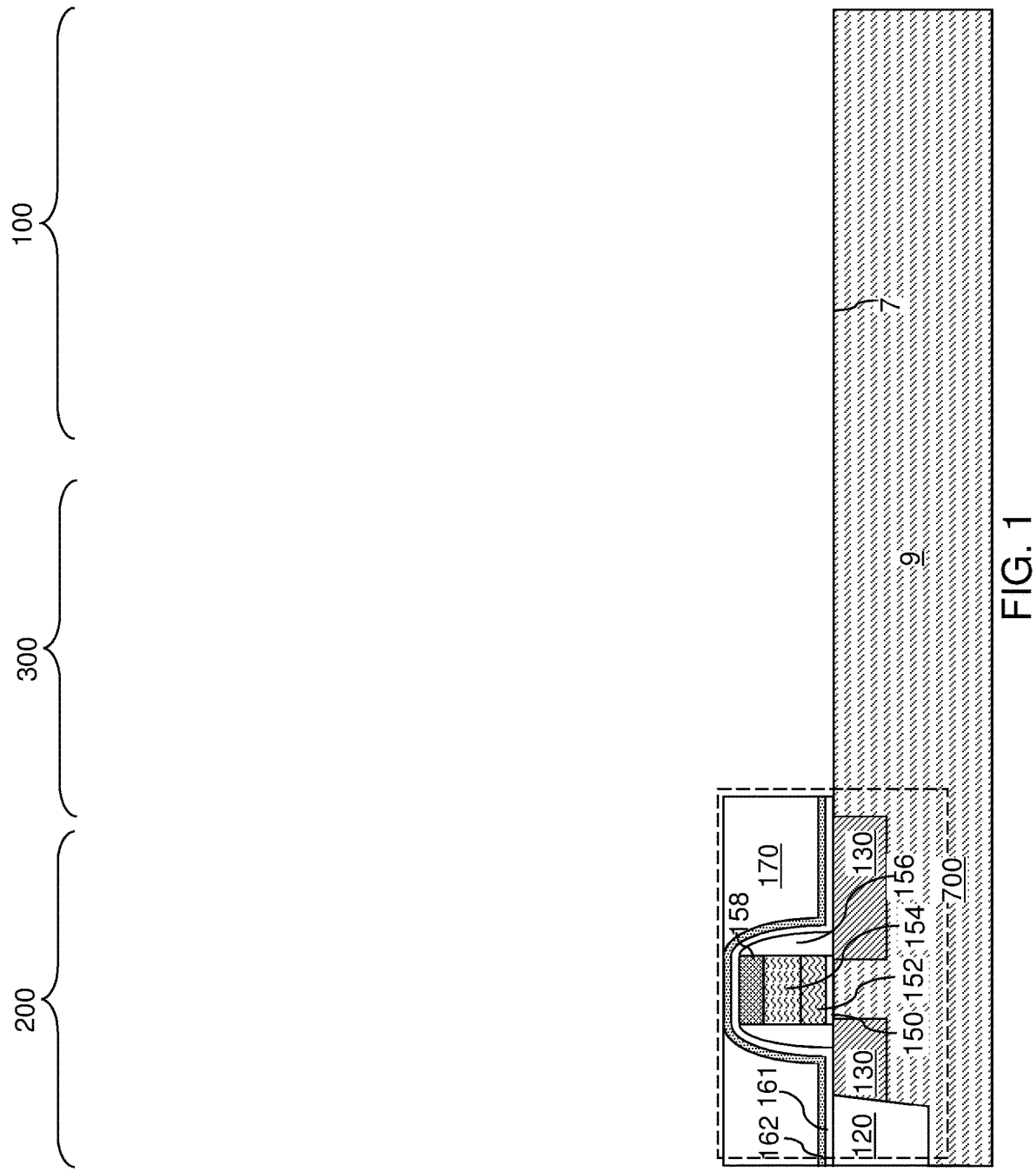
FIG. 1 is a schematic vertical cross-sectional view of a first exemplary structure after formation of at least one peripheral device according to a first embodiment of the present disclosure.

As discussed above, the present disclosure is directed to a three-dimensional memory device employing level-shifted staircases for reducing height variations in contact via structures and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate including a substrate semiconductor layer 9. The substrate semiconductor layer 9 maybe a semiconductor wafer (e.g., a silicon wafer) or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The substrate semiconductor layer 9 can include a continuous horizontal top surface. The continuous horizontal top surface can be a major surface 7, i.e., a surface that includes a significant fraction of the surface area of the substrate semiconductor layer 9. The major surface 7 can be contained entirely within a horizontal plane. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from $1.0$ S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
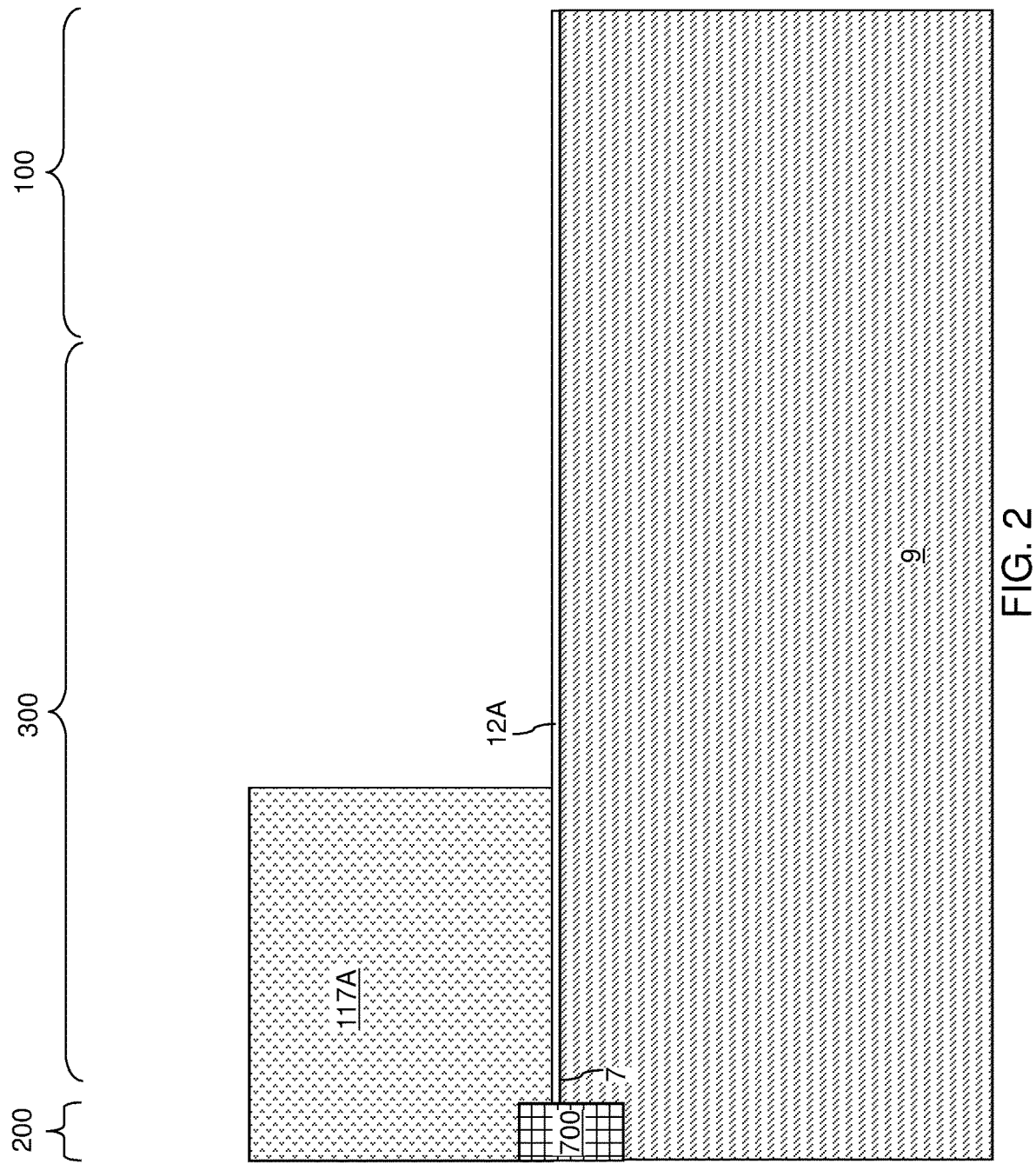
FIG. 2 is a schematic vertical cross-sectional view of the first exemplary structure after formation of a first dielectric pad layer and application and patterning of a first photoresist layer according to the first embodiment of the present disclosure.

Referring to FIG. 2, a first dielectric pad layer 12A can be formed on the top surface of the substrate semiconductor layer 9. The first dielectric pad layer 12A includes a dielectric material. In one embodiment, the first dielectric pad layer 12A includes a dielectric oxide of the semiconductor material in the substrate semiconductor layer 9. For example, the substrate semiconductor layer 9 can include silicon, and the first dielectric pad layer 12A can include silicon oxide formed by thermal oxidation or plasma oxidation of a surface portion of the substrate semiconductor layer 9. Alternatively or additionally, the first dielectric pad layer 12A can be formed by deposition of a dielectric material such as silicon oxide. The thickness of the first dielectric pad layer 12A can be in a range from 2 nm to 60 nm, such as from 4 nm to 30 nm, although lesser and greater thicknesses can also be employed.

A first photoresist layer 117A can be applied over the first dielectric pad layer 12A and the at least one semiconductor device 700 (if present), and can be lithographically patterned to cover the peripheral device region 200 and a portion of the contact region 300 that is distal from the memory array region 100.

Figure 3:
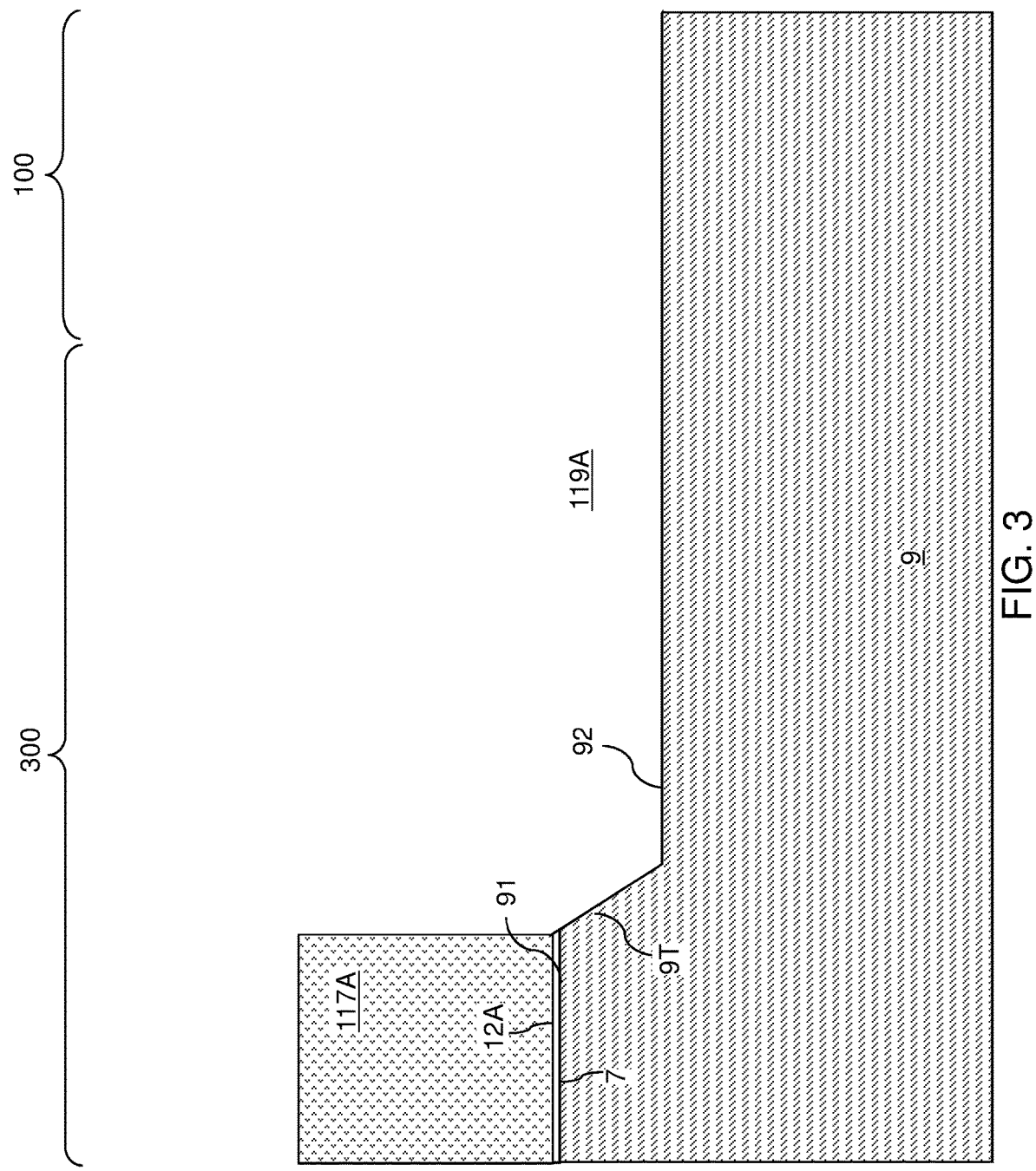
FIG. 3 is a schematic vertical cross-sectional view of the first exemplary structure after formation of a first recess region with a first tapered sidewall according to the first embodiment of the present disclosure.

Referring to FIG. 3, an etch process can be performed to etch physically exposed portions of the first dielectric pad layer 12A and underlying portions of the substrate semiconductor layer 9. Unmasked portions of the continuous horizontal top surface (i.e., the major surface 7) of the substrate semiconductor layer 9 as provided at the processing step of FIG. 1 can be locally recessed by the etch process. A first recess region 119A is formed by vertically and laterally recessing the substrate semiconductor layer 9 employing the first photoresist layer 117A as an etch mask. The first photoresist layer 117A may, or may not, be trimmed during the etch process. The horizontal top surface 91 portion of the major surface 7 of the substrate semiconductor layer 9 masked by the photoresist layer 117A is not etched.

The first recessed region 119A includes a recessed horizontal top surface 92 of the substrate semiconductor layer 9 (which is herein referred to as a first recessed horizontal top surface) and a tapered sidewall 9T (which is herein referred to as a first tapered sidewall). The first tapered sidewall 9T adjoins the first recessed horizontal top surface of the substrate semiconductor layer 9.

In some embodiments, the etch process can include an anisotropic etch process such as a reactive ion etch (RIE) process. In one embodiment, the anisotropic etch process can trim the first photoresist layer 117A during etching of the semiconductor material of the substrate semiconductor layer 9 so that an additional area is subjected to an etchant during the anisotropic etch process. In this case, the first tapered sidewall 9T can be formed by the gradual decrease in exposure time to the etchant within the area over which a sidewall of the patterned photoresist layer 117A shifts during the anisotropic etch process. The rate of trimming of the first photoresist layer 117A and the etch rate of the semiconductor material of the substrate semiconductor layer 9 can determine the taper angle of the first tapered sidewall 9T.

In one embodiment, the anisotropic etch process can generate a viscous polymer through reaction of the surface portions of the first photoresist layer 117A and an etchant of the anisotropic etch process. For example, the viscous polymer can include an organic polymer that flows down the sidewalls of the first photoresist layer 117A and cover sidewalls of the first recessed region 119A, thereby inducing formation of the first tapered sidewall 9T. In this case, the material of the first photoresist layer 117A and the etch chemistry of the anisotropic etch process can be selected to enhance generation of the viscous polymer and/or to be selective to the material of the viscous polymer, i.e., provide a significant etch rate for the semiconductor material of the substrate semiconductor layer 9 with minimal etch rate for the viscous polymer.

In some embodiments, the etch process can include an isotropic etch process. The isotropic etch process can be a dry etch process (such as chemical dry etch) or a wet etch process. An exemplary etchant for a dry etch process is HCL vapor. If a wet etch process is performed, the wet etch process may, or may not, form crystallographic facets. Exemplary wet etchants include KOH or trimethyl-2 hydroxyethyl ammonium hydroxide (often called TMY or TMAH).

The depth of the first recessed region 119A, as measured vertically between a horizontal plane including the major surface 7 and a horizontal plane including the first recessed horizontal top surface, can be in a range from 80 nm to 4,000 nm, such as from 160 nm to 2,000 nm, although lesser and greater thicknesses can also be employed. Generally, the depth of the first recessed region 119A can be in a range from twice the thickness of a pair of an insulating layer and a spacer material layer to be subsequently formed to about N/n times the thickness of a pair of an insulating layer and a spacer material layer to be subsequently formed. N is the total number of pairs of an insulating layer and a spacer material layer to be subsequently formed (which is the same as the total number of electrically conductive layers to be subsequently formed), and n is the total number of staircase regions to be subsequently formed. N can be in a range from 32 to 1,024, and n can be in a range from 2 to 20.

The taper angle of the first tapered sidewall 9T, as measured from a vertical line that is perpendicular to the major surface 7 of the substrate semiconductor layer 9, can be in a range from 10 degrees to 80 degrees, such as from 20 degrees to 70 degrees and/or from 30 degrees to 60 degrees, although lesser and greater taper angles can also be employed. The first photoresist layer 117A can be subsequently removed, for example, by ashing.

Figure 4:
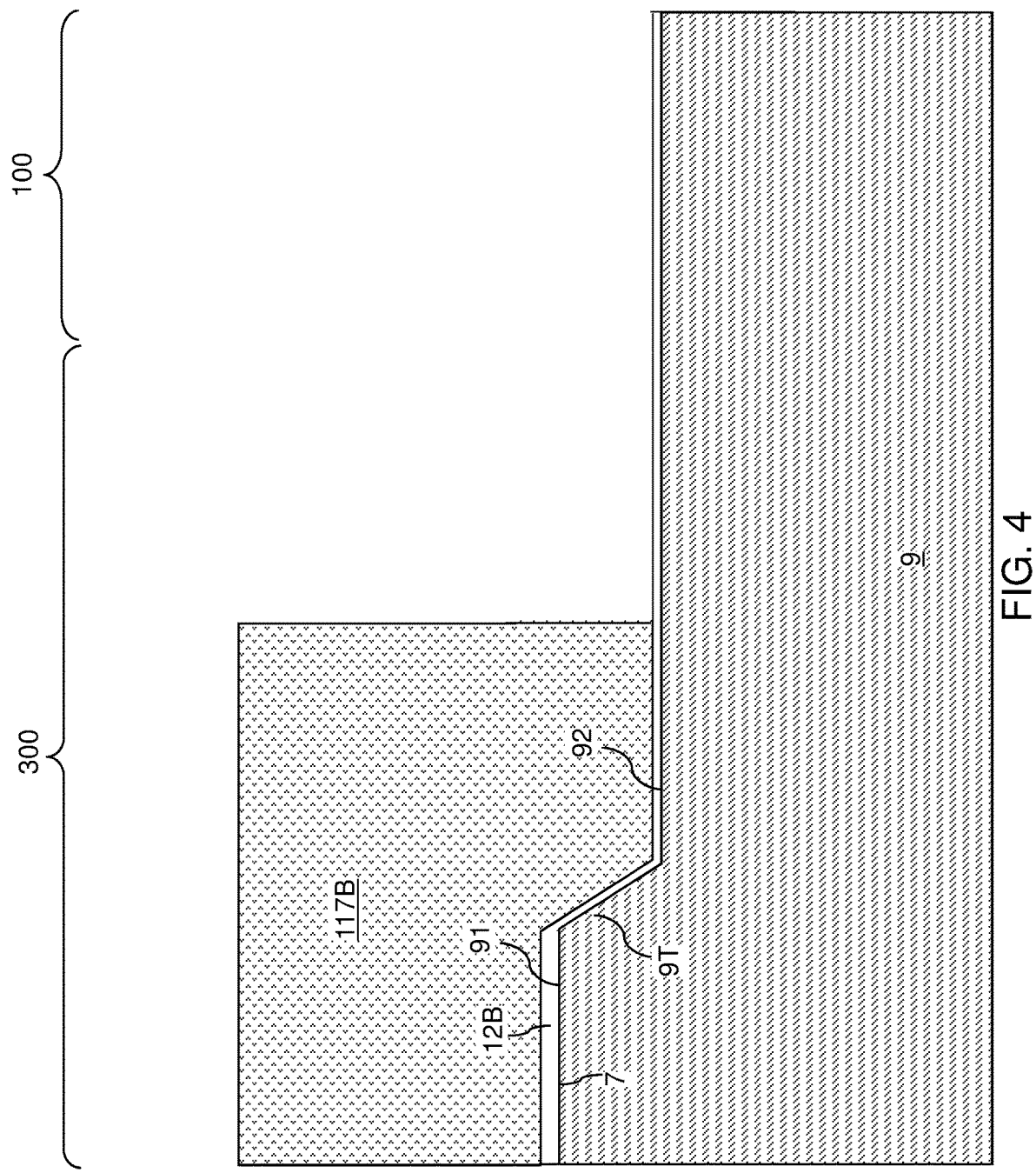
FIG. 4 is a schematic vertical cross-sectional view of the first exemplary structure after formation of a second dielectric pad layer and application and patterning of a second photoresist layer according to the first embodiment of the present disclosure.

Referring to FIG. 4, a second dielectric pad layer 12B can be formed on the physically exposed surfaces of the substrate semiconductor layer 9. The second dielectric pad layer 12B includes a dielectric material. In one embodiment, the second dielectric pad layer 12B includes a dielectric oxide of the semiconductor material in the substrate semiconductor layer 9. For example, the substrate semiconductor layer 9 can include silicon, and the second dielectric pad layer 12B can include silicon oxide formed by thermal oxidation or plasma oxidation of the horizontal surface portions 91 of the substrate semiconductor layer 9 that correspond to the major surface 7, the first tapered sidewall 9T, and the recessed horizontal top surface 92 underlying the first recessed region 119A. Alternatively or additionally, the second dielectric pad layer 12B can be formed by deposition of a dielectric material such as silicon oxide. The first dielectric pad layer 12A may be removed prior to formation of the second dielectric pad layer 12B, or may be incorporated into the second dielectric pad layer 12B. The thickness of the portion of the second dielectric pad layer 12B formed on the recessed top surface of the substrate semiconductor layer 9 in the memory array region 100 can be in a range from 2 nm to 60 nm, such as from 4 nm to 30 nm, although lesser and greater thicknesses can also be employed.

A second photoresist layer 117B can be applied over the second dielectric pad layer 12B, and can be lithographically patterned to cover the peripheral device region 200 and a portion of the contact region 300 that is distal from the memory array region 100. The area covered by the second photoresist layer 117B can include the entirety of the unrecessed horizontal top surface 91 (i.e., the major surface 7), the first tapered sidewall 9T, and a distal portion of the recessed horizontal top surface 92 of the substrate semiconductor layer 9 that is laterally spaced from the memory array region 100. However, a proximal portion of the recessed horizontal top surface 92 of the substrate semiconductor layer 9 (i.e., the portion that is laterally closer to the memory array region 100 than the distal portion) is not covered by the second photoresist layer 117B.

Figure 5:
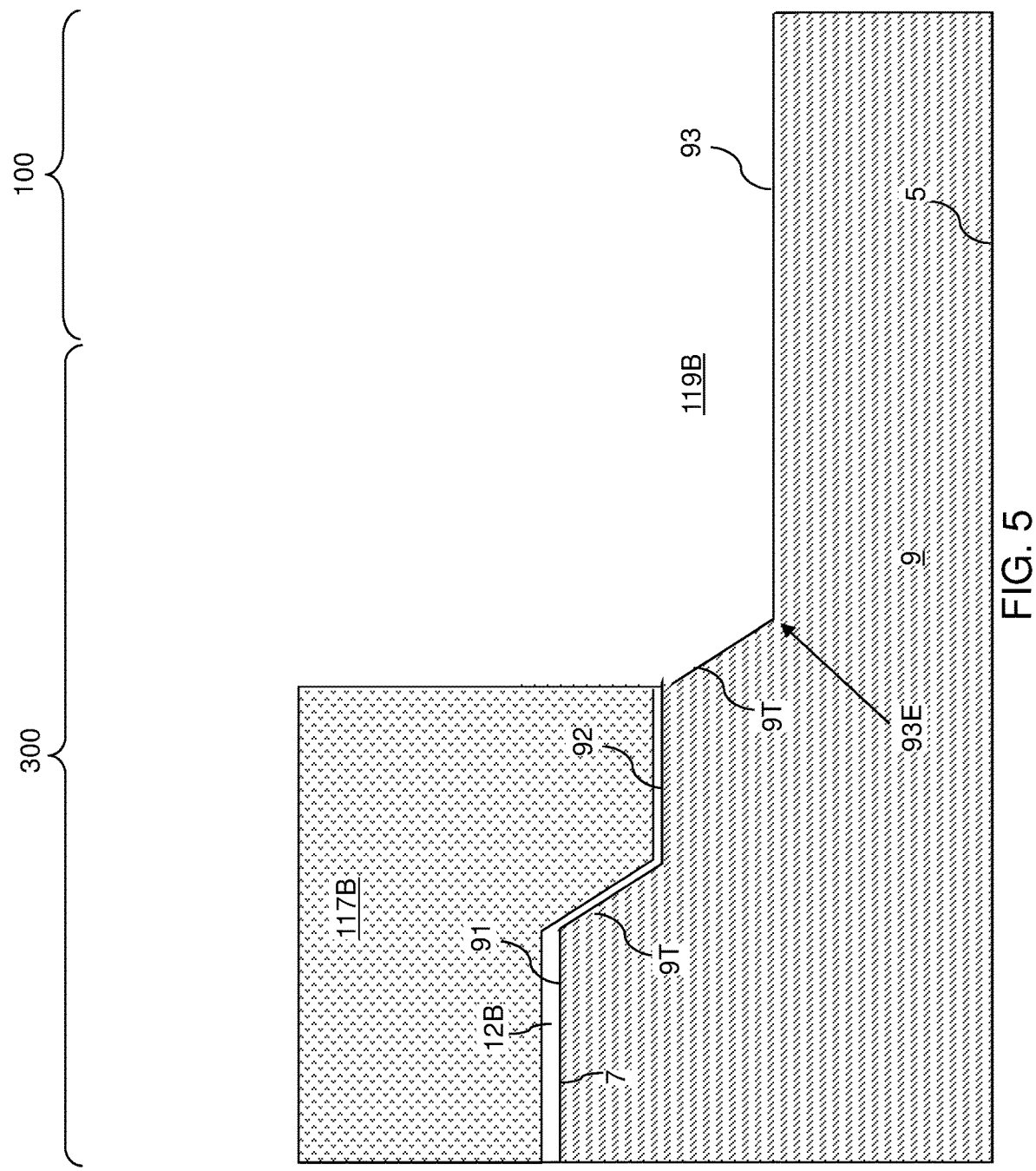
FIG. 5 is a schematic vertical cross-sectional view of the first exemplary structure after formation of a second recess region with a second tapered sidewall according to the first embodiment of the present disclosure.

Referring to FIG. 5, an etch process can be performed to etch physically exposed portions of the second dielectric pad layer 12B and underlying portions of the substrate semiconductor layer 9. Unmasked portions of the first recessed horizontal top surface of the substrate semiconductor layer 9 as provided at the processing step of FIG. 3 can be locally recessed by the etch process. A second recess region 119B is formed by vertically and laterally recessing the substrate semiconductor layer 9 employing the second photoresist layer 117B as an etch mask. The second photoresist layer 117B may, or may not, be trimmed during the etch process.

The second recessed region 119B includes another recessed horizontal top surface 93 of the substrate semiconductor layer 9, which is herein referred to as a second recessed horizontal top surface. The second recessed region 119B includes another tapered sidewall 9T, which is herein referred to as a second tapered sidewall 9T. The second tapered sidewall 9T adjoins the second recessed horizontal top surface 93 of the substrate semiconductor layer 9.

In some embodiments, the etch process can include an anisotropic etch process such as a reactive ion etch (RIE) process and/or an isotropic etch process. The same type of anisotropic etch processes and/or isotropic etch processes can be employed to form the second recessed region 119B as the anisotropic etch processes and/or the isotropic etch processes that may be employed to form the first recessed region 119A.

The depth of the second recessed region 119B, as measured vertically between a horizontal plane including the first recessed horizontal top surface and a horizontal plane including the second recessed horizontal top surface, can be in a range from 80 nm to 4,000 nm, such as from 160 nm to 2,000 nm, although lesser and greater thicknesses can also be employed. In one embodiment, the depth of the second recessed region 119B can be approximately the same as the depth of the first recessed region 119A.

The taper angle of the second tapered sidewall 9T, as measured from a vertical line that is perpendicular to the major surface 7 of the substrate semiconductor layer 9, can be in a range from 10 degrees to 80 degrees, such as from 20 degrees to 70 degrees and/or from 30 degrees to 60 degrees, although lesser and greater taper angles can also be employed. The second photoresist layer 117B can be subsequently removed, for example, by ashing. Subsequently, the second dielectric pad layer 12B can be removed selective to the semiconductor material of the substrate semiconductor layer 9, for example, by a wet etch. For example, if the second dielectric pad layer 12B includes silicon oxide, a wet etch employing hydrofluoric acid can be employed to remove the second dielectric pad layer 12B.

Generally, the set of processing steps of FIGS. 2 and 3 (which can be the same as the set of processing steps of FIGS. 4 and 5) can be repeated (n−1) times, in which n is the total number of staircase regions to be formed. A plurality of horizontal top surfaces of the substrate can be formed, which are top surfaces of the substrate semiconductor layer 9 that are formed by locally recessing portions of the continuous horizontal top surface of the substrate semiconductor layer 9 as provided at the processing steps of FIG. 1. The plurality of horizontal top surfaces (91, 92, 93) of the substrate semiconductor layer 9 can be parallel among one another, and can be vertically offset among one another by tapered sidewalls 9T.

A plurality of horizontal top surfaces (91, 92, 93) that are vertically offset thereamongst is provided on a substrate. The plurality of horizontal top surfaces (91, 92, 93) comprises a memory array region horizontal top surface 93 and at least one plateau top surface (91, 92) that is located above a horizontal plane including the memory array region horizontal top surface 93. In one embodiment, the at least one plateau top surface (91, 92) comprise a plurality of plateau surfaces (91, 92). The memory array region horizontal top surface 93 is formed in the memory array region 100, and is more proximal to a back side surface 5 of the substrate (e.g., the backside surface of the substrate semiconductor layer 9, such as a backside surface of a silicon wafer opposite to the major surface 7) than any other of the plurality of horizontal top surfaces (91, 92, 93). The height of each of the plurality of plateau surfaces (91, 92) from the horizontal plane including the memory array region horizontal top surface 93 increases with a lateral distance from an edge 93E of the memory array region horizontal top surface.

Generally, the plurality of horizontal top surfaces (91, 92, 93) can be formed by performing at least once a set of processing steps. The set of processing steps can include a first step of forming a respective patterned photoresist layer (117A, 117B) outside the memory array region 100, and a second step of recessing a respective region of the substrate semiconductor layer 9 in the substrate that is not masked by the respective patterned photoresist layer (117A, 117B) to form a respective recessed region (119A, 119B). Recessing the respective region of the substrate semiconductor layer 9 can be effected by an etch process that forms a respective tapered sidewall 9T of the substrate semiconductor layer 9. The respective tapered sidewall 9T adjoins a recessed horizontal top surface of the substrate semiconductor layer 9. The set of processing steps can be performed (n−1) times, in which n is the total number of staircase regions to be formed. The height of the steps (i.e., horizontal surfaces) in the substrate can increase in a first lateral direction (e.g., in a direction away from the memory array region 100, such that the horizontal surfaces that are more distal from the memory array region are higher (i.e., farther away from the back side surface 5) than the horizontal surfaces that are more proximal to the memory array region).

Figure 6:
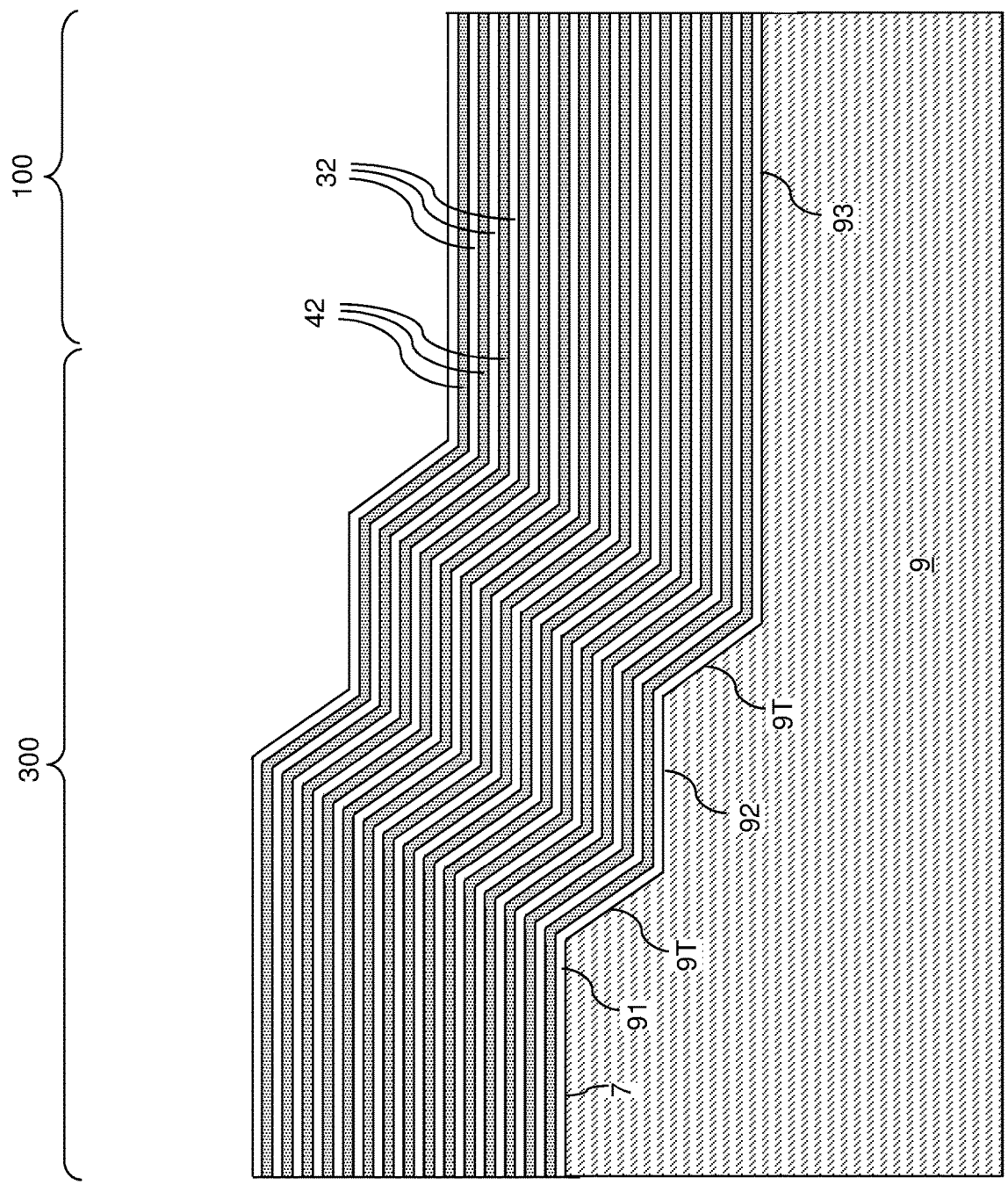
FIG. 6 is a schematic vertical cross-sectional view of the first exemplary structure after formation of an alternating stack of insulating layers and spacer material layers according to the first embodiment of the present disclosure.

Referring to FIG. 6, a stack of an alternating plurality of first material layers (which can be insulating layers 32) and second material layers (which can be spacer material layer 42) is formed over the top surface of the substrate semiconductor layer 9. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer. In this case, the stack can include an alternating plurality of insulating layers 32 and spacer material layers 42, and constitutes a prototype stack of alternating layers comprising insulating layers 32 and spacer material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and spacer material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

In one embodiment, the second material of the spacer material layers 42 can be a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

If the spacer material layers 42 are sacrificial material layers, the spacer material layers 42 may comprise an insulating material, a semiconductor material, or a conductive material. In this case, the second material of the spacer material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the spacer material layers 42 can comprise silicon nitride or a semiconductor material including at least one of silicon and germanium.

In one embodiment, the insulating layers 32 can include silicon oxide, and spacer material layers 42 can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the spacer material layers 42 can be formed, for example, CVD or atomic layer deposition (ALD).

In case the spacer material layers 42 are sacrificial material layers, the spacer material layers 42 can be suitably patterned so that conductive material portions to be subsequently formed by replacement of the spacer material layers 42 can function as electrically conductive electrodes, such as the control gate electrodes of the monolithic three-dimensional NAND string memory devices to be subsequently formed. The spacer material layers 42 may comprise a horizontal portions and tapered portions which follow the shape of the underlying substrate surfaces (91, 92, 93 and 9T).

In one embodiment, each of the insulating layers 32 and the spacer material layers 42 can be formed as a conformal material layer by a conformal deposition process such as chemical vapor deposition. The thicknesses of the insulating layers 32 and the spacer material layers 42 can be in a range from 20 nm to 50 nm, although lesser and greater thicknesses can be employed for each insulating layer 32 and for each spacer material layer 42. The number of repetitions of the pairs of an insulating layer 32 and a spacer material layer 42 (e.g., a control gate electrode or a sacrificial material layer) can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

Alternatively, the spacer material layers 42 can be formed as electrically conductive layers. In this case, steps for replacing the spacer material layers with electrically conductive layers can be omitted.

Figure 7:
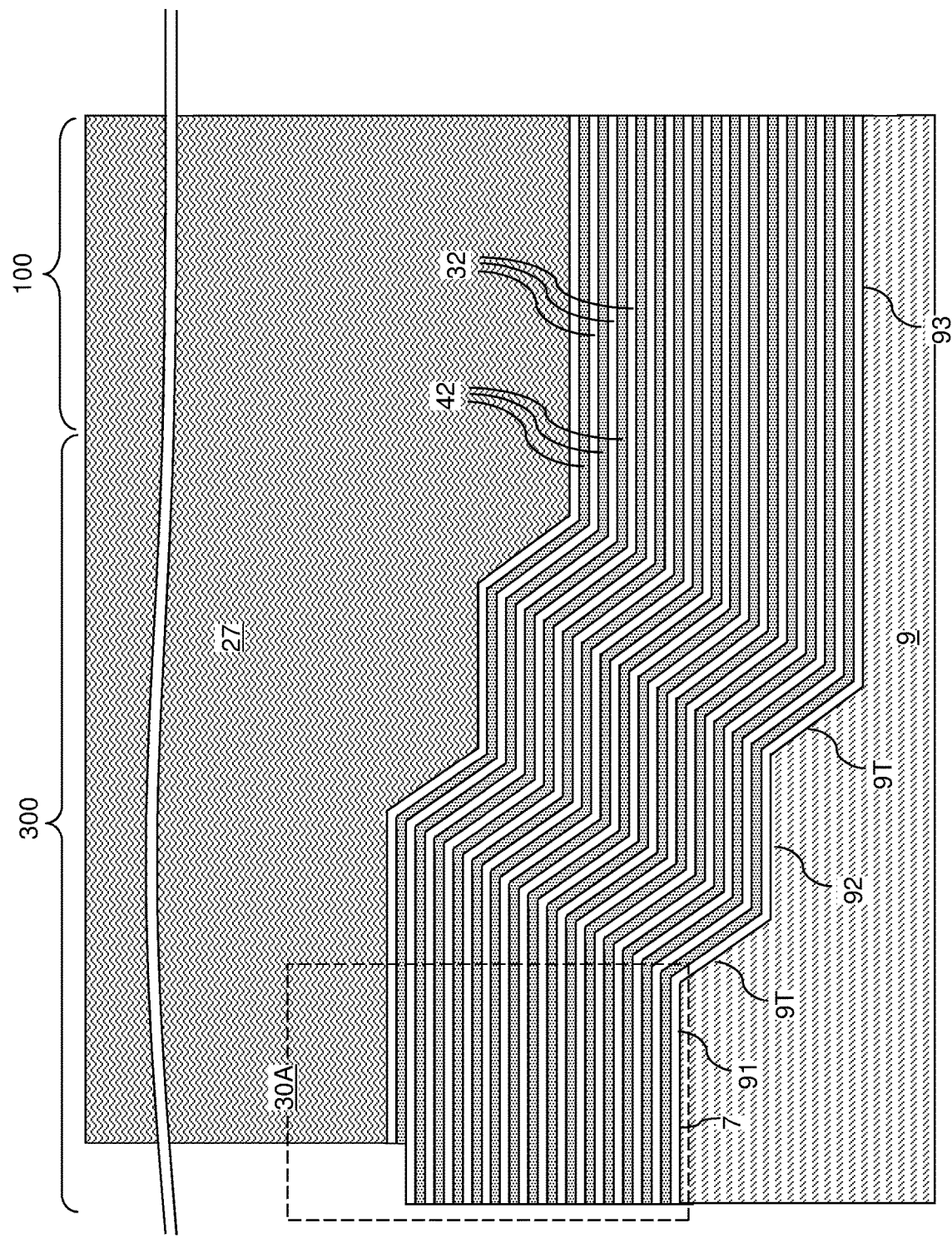
FIG. 7 is a schematic vertical cross-sectional view of the first exemplary structure after application and patterning of a trimming mask layer and anisotropically etching an unmasked region of a topmost pair of layers in the alternating stack according to the first embodiment of the present disclosure.

Referring to FIG. 7, a trimming mask layer 27 can be formed over the alternating stack (32, 42), and can be lithographically patterned to cover the entirety of the memory array region 100 and a proximal portion of the contact region 300 that is adjoined to the memory array region 100, while not covering the peripheral device region 200 or a distal portion of the contact region 300 that is adjoined to the peripheral device region 200. In one embodiment, the trimming mask layer 27 as patterned can overlie the entirety of the memory array region horizontal top surface 93, each of the plurality of plateau top surfaces 92 other than the topmost surface 91 of the plateau top surfaces (91, 92) (i.e., other than the major surface 7), each of the tapered sidewalls 9T connecting the plurality of horizontal top surfaces (91, 92, 93), and a proximal portion of the topmost one 91 of the plateau top surfaces (91, 92) within the contact region 300. In other words, a sidewall of the trimming mask layer 27 can be located within a distal portion of the contact region 300 that includes the area of the topmost one 91 of the plateau top surfaces (91, 92).

The trimming mask layer 27 includes a material that can be trimmed by an etch process or an ashing process. For example, the trimming mask layer 27 can include a photoresist material, an organic polymer, an inorganic polymer, amorphous carbon, or diamond-like carbon (DLC). The thickness of the trimming mask layer 27 can be greater than the total lateral extent of stepped surfaces to be subsequently formed. For example, the thickness of the trimming mask layer 27 can be in a range from 1 micron to 20 microns, although lesser and greater thicknesses can also be employed.

An anisotropic etch can be performed employing the trimming mask layer 27 as an etch mask to etch unmasked region of the topmost pair of layers in the alternating stack (32, 42), i.e., the topmost insulating layer 32 and the topmost spacer material layer 42. A vertical step is formed in the alternating stack (32, 42) directly underneath a sidewall of the trimming mask layer 27. The vertical step is formed in the contact region 300 over the topmost one 91 of the plurality of horizontal top surfaces (91, 92, 93) within a first staircase region 30A. The area from which the topmost insulating layer 32 and the topmost spacer material layer 42 are removed is herein referred to as a first step area.

Figure 8:
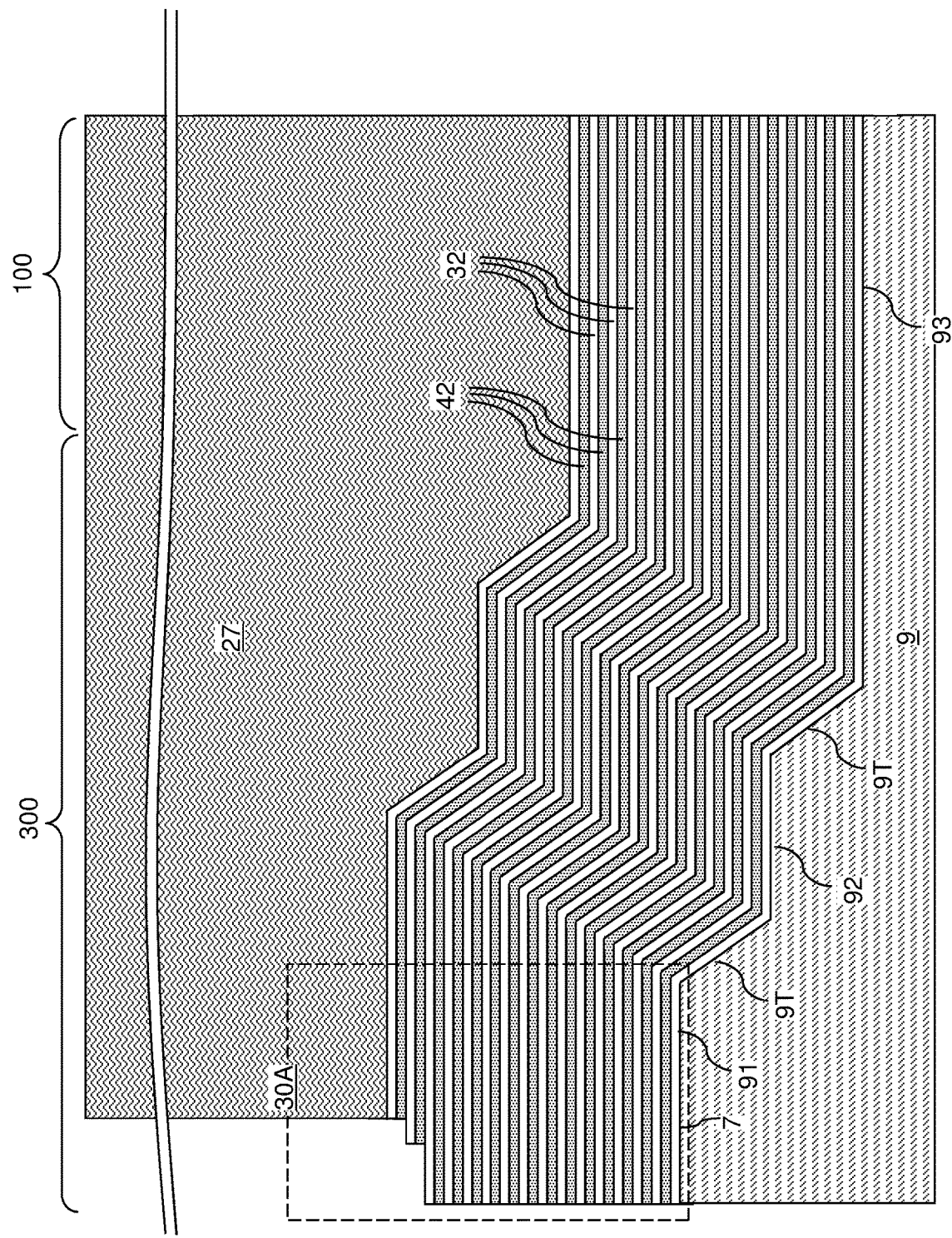
FIG. 8 is a schematic vertical cross-sectional view of the first exemplary structure after trimming the trimming mask layer and anisotropically etching unmasked regions of the alternating stack in a first staircase region by the distance of a pair of an insulating layer and a sacrificial material layer according to the first embodiment of the present disclosure.

Referring to FIG. 8, the trimming mask layer 27 is trimmed by performing a trimming step. The newly exposed area is a second step area, in which a new stepped surface is subsequently formed. An isotropic etch process or an ashing process can be employed for the trimming step. The duration of the trimming process can be selected such that the trimming distance (i.e., the distance by which the trimming mask layer 27 is trimmed) is the same as the horizontal dimension of the next step to be formed on the alternating stack (32, 42). For example, the trimming distance can be in a range from 100 nm to 500 nm, although lesser and greater trimming distances can also be employed. The area from which the topmost insulating layer 32 and the topmost spacer material layer 42 are removed during the anisotropic etch process of FIG. 8 is herein referred to as a second step area. A second-from-the-top insulating layer 32 and a second-from-the-top spacer material layer 42, which are the two topmost layers in the first step area after the anisotropic etch of FIG. 7 and prior to the anisotropic etch of FIG. 8, are removed from the first step area during the anisotropic etch of FIG. 8.

Generally, a set of processing steps can be repeatedly performed to form stepped surfaces in the first staircase region 30A. The set of processing steps can include an anisotropic etch step in which a respective pair of two topmost layers in the alternating stack (32, 42) is anisotropically etched within each step area that is not covered by the trimming mask layer 27, and a trimming step in which the trimming mask layer 27 is trimmed, thereby providing a respective newly-formed step area that is not covered by the trimming mask layer 27. In one embodiment, about (N/n−1) vertical steps can be formed in the first staircase region 30A by performing the set of processing steps (N/n−2) times during the processing steps of FIG. 8 after the first anisotropic etch process at the processing steps of FIG. 7. N is the total number of electrically conductive layers to be formed, and n is the total number of staircase regions to be formed.

The distance by which the trimming mask layer 27 is trimmed during each trimming step during formation of the first staircase region 30A is herein referred to as an intra-staircase-region trimming distance, i.e., a trimming distance employed to shift a sidewall of the trimming mask layer 27 within a staircase region. A respective newly-formed step area is formed entirely within the first staircase region 30A during each of the trimming steps.

Figure 9:
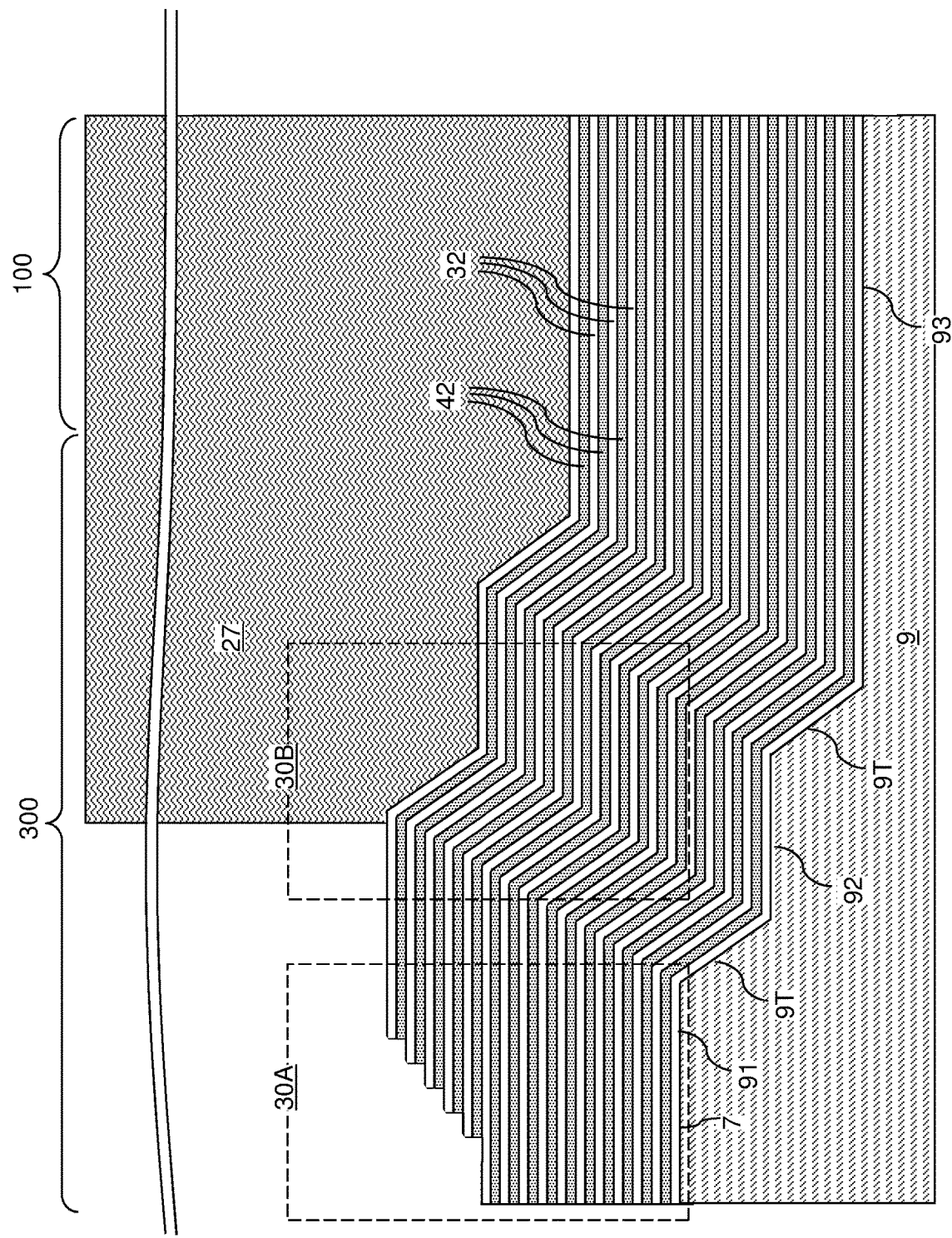
FIG. 9 is a schematic vertical cross-sectional view of the first exemplary structure after formation of first stepped surfaces in a first staircase region and after moving a sidewall of the trimming mask layer from the first staircase region to a second staircase region by trimming the trimming mask layer according to the first embodiment of the present disclosure.

Referring to FIG. 9, the trimming mask layer 27 is trimmed so that a sidewall of the trimming mask layer 27 moved from the first staircase region 30A to a second staircase region 30B. The lateral distance by which the trimming mask layer 27 moves is herein referred to as an inter-staircase-region trimming distance. In this case, a newly-formed step area extends across a neighboring pair of staircase regions (30A, 30B), i.e., across the first staircase region 30A and the second staircase region 30B. In one embodiment, the inter-staircase trimming distance can be greater than the maximum of the intra-staircase-region trimming distances by a factor in a range from 2 to 20. Alternatively, rather than moving the trimming mask layer 27 by the inter-staircase-region trimming distance, the trimming mask layer 27 is removed and a new trimming mask layer is formed for staircase region 30B with the configuration shown in FIG. 9.

Figure 10:
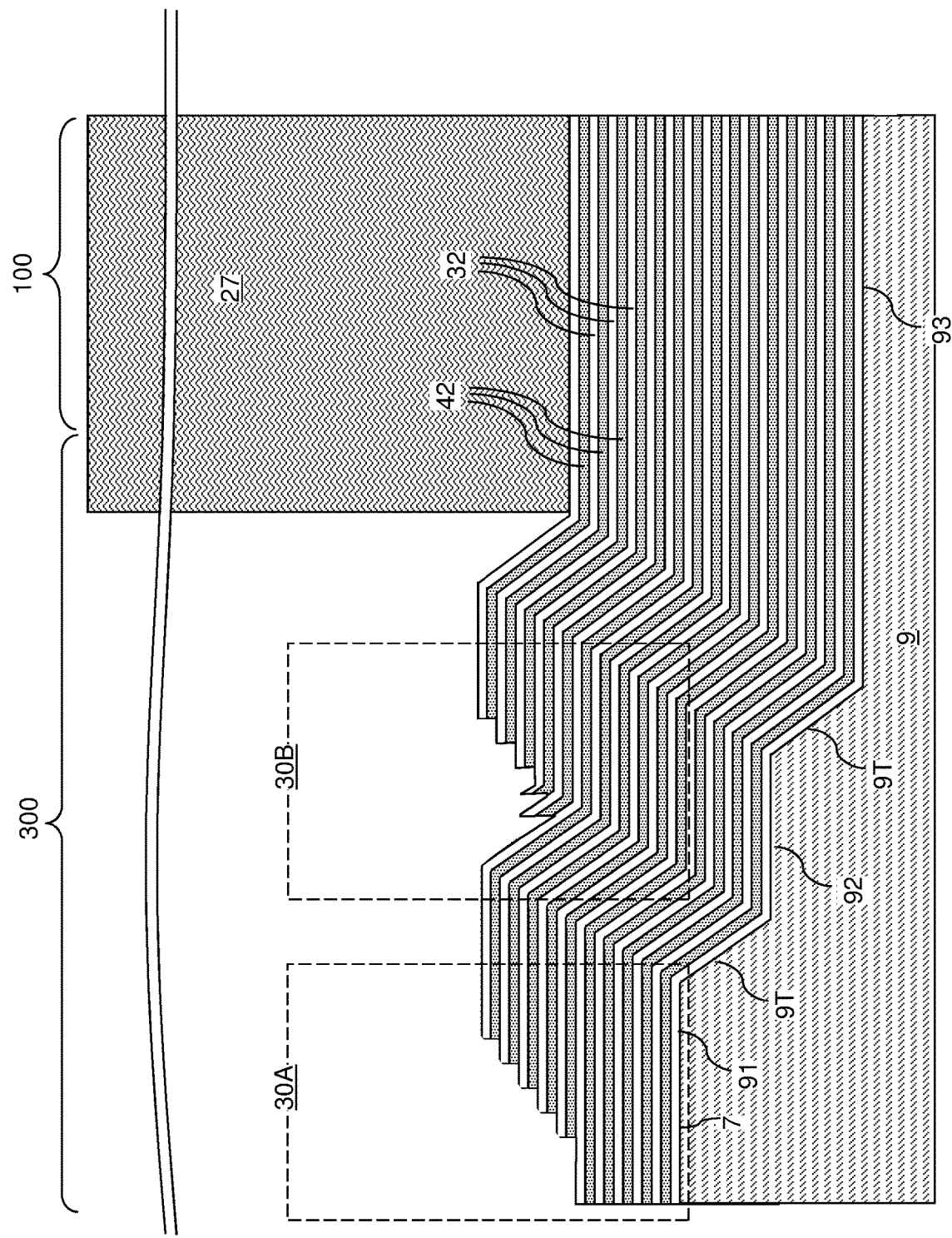
FIG. 10 is a schematic vertical cross-sectional view of the first exemplary structure after formation of second stepped surfaces in the second staircase region and after moving a sidewall of the trimming mask layer from the second staircase region to a third staircase region by trimming the trimming mask layer according to the first embodiment of the present disclosure.

Referring to FIG. 10, the processing steps of FIGS. 8 and 9 can be performed again to form stepped surfaces in the second staircase region 30B. Upon completion of formation of the stepped surfaces in the second staircase region 30B, the trimming mask layer 27 can be trimmed by an inter-staircase-region trimming distance. Alternatively, rather than moving the trimming mask layer 27 by the inter-staircase-region trimming distance, the trimming mask layer 27 is removed and a new trimming mask layer is formed with the configuration shown in FIG. 10.

Figure 11:
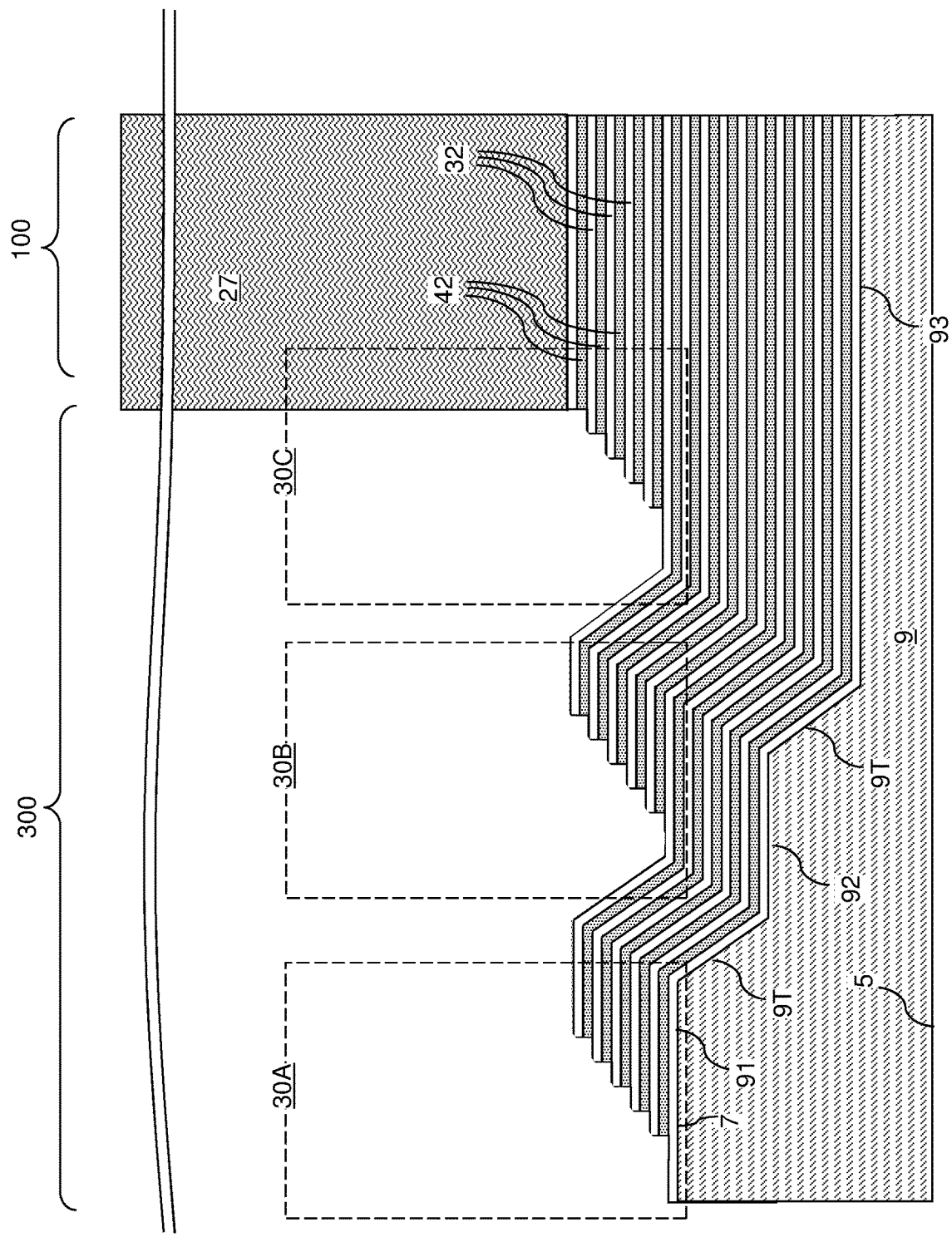
FIG. 11 is a schematic vertical cross-sectional view of the first exemplary structure after formation of third stepped surfaces in the third staircase region according to the first embodiment of the present disclosure.

Referring to FIG. 11, the set of processing steps of FIG. 10 may be subsequently repeated (n−2) times after formation of the stepped surfaces in the second staircase region 30B. A total of n staircase regions (30A, 30B, 30C) can be formed. In one embodiment, the number of vertical steps within each of the plurality of staircase regions (30A, 30B, 30C) can be in a range from [N/n−3] to [N/n+2] in which the symbol [ ] refers to a truncation operation that retains only an integer value of the operand therein and truncates all digits below the decimal point.

Generally, a plurality of staircase regions (30A, 30B, 30C) can be formed by patterning the alternating stack (32, 42). Each of the plurality of staircase regions (30A, 30B, 30C) is formed over a respective one of the plurality of horizontal top surfaces (91, 92, 93). A respective subset of the spacer material layers 42 within each of the plurality of staircase regions (30A, 30B, 30C) has a lateral extent that decreases with a vertical distance from the back side surface 5 of the substrate. The height of the steps (i.e., horizontal surfaces) of the spacer material layers 42 can increase in a second lateral direction (e.g., in a direction toward from the memory array region 100, such that the horizontal surfaces that are more proximal to the memory array region are higher (i.e., farther away from the back side surface 5) than the horizontal surfaces that are more distal from the memory array region). Thus, the height of the steps of the spacer material layers 42 (and thus the height of the steps of the word lines)

increases in the opposite lateral direction from the height of the steps in the substrate (e.g., in the substrate semiconductor layer 9). Each of the plurality of staircase regions (30A, 30B, 30C) can be formed by repeatedly performing a set of processing steps including an anisotropic etch step in which a respective pair of two topmost layers is anisotropically etched within each step area that is not covered by the trimming mask layer 27 and the underlying pair(s) of layers are etched further to form additional steps, and a trimming step in which the trimming mask layer 27 is trimmed, thereby forming a respective newly-formed step area that is not covered by the trimming mask layer 27. When a sidewall of the trimming mask layer 27 is trimmed within a staircase region (30A, 30B, or 30C), the trimming mask layer 27 is trimmed by an intra-staircase trimming distance. Optionally, when the sidewall of the trimming mask layer 27 is trimmed from a staircase region to a next staircase region, the trimming mask layer 27 is trimmed by an inter-staircase trimming distance. Each inter-staircase trimming distance can be greater than a maximum of the intra-staircase-region trimming distances by a factor in a range from 2 to 20.

Figure 12A:
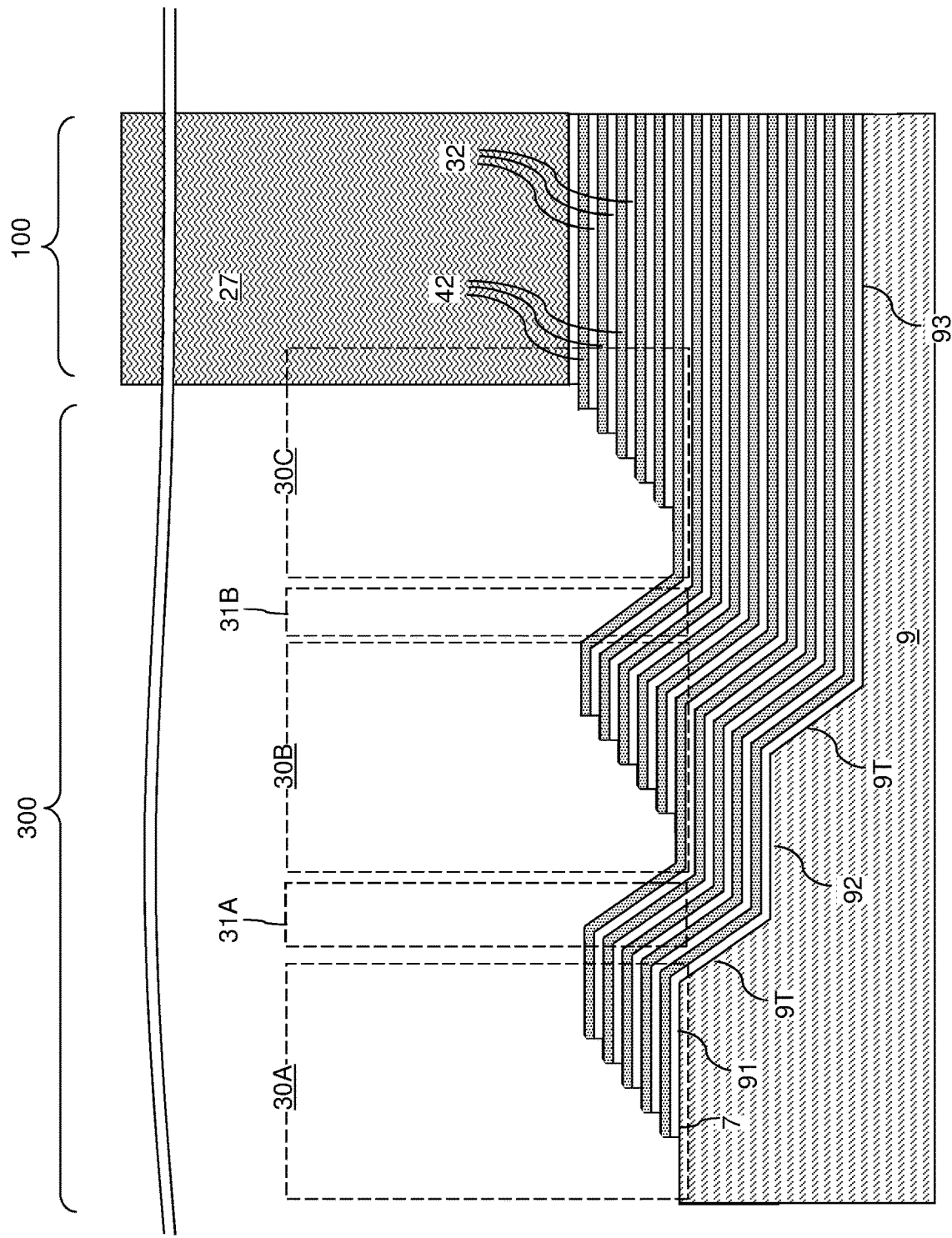
FIG. 12A is a schematic vertical cross-sectional view of the first exemplary structure after trimming the trimming mask layer and anisotropically etching physically exposed portions of the insulating layers according to the first embodiment of the present disclosure.
Figure 12B:
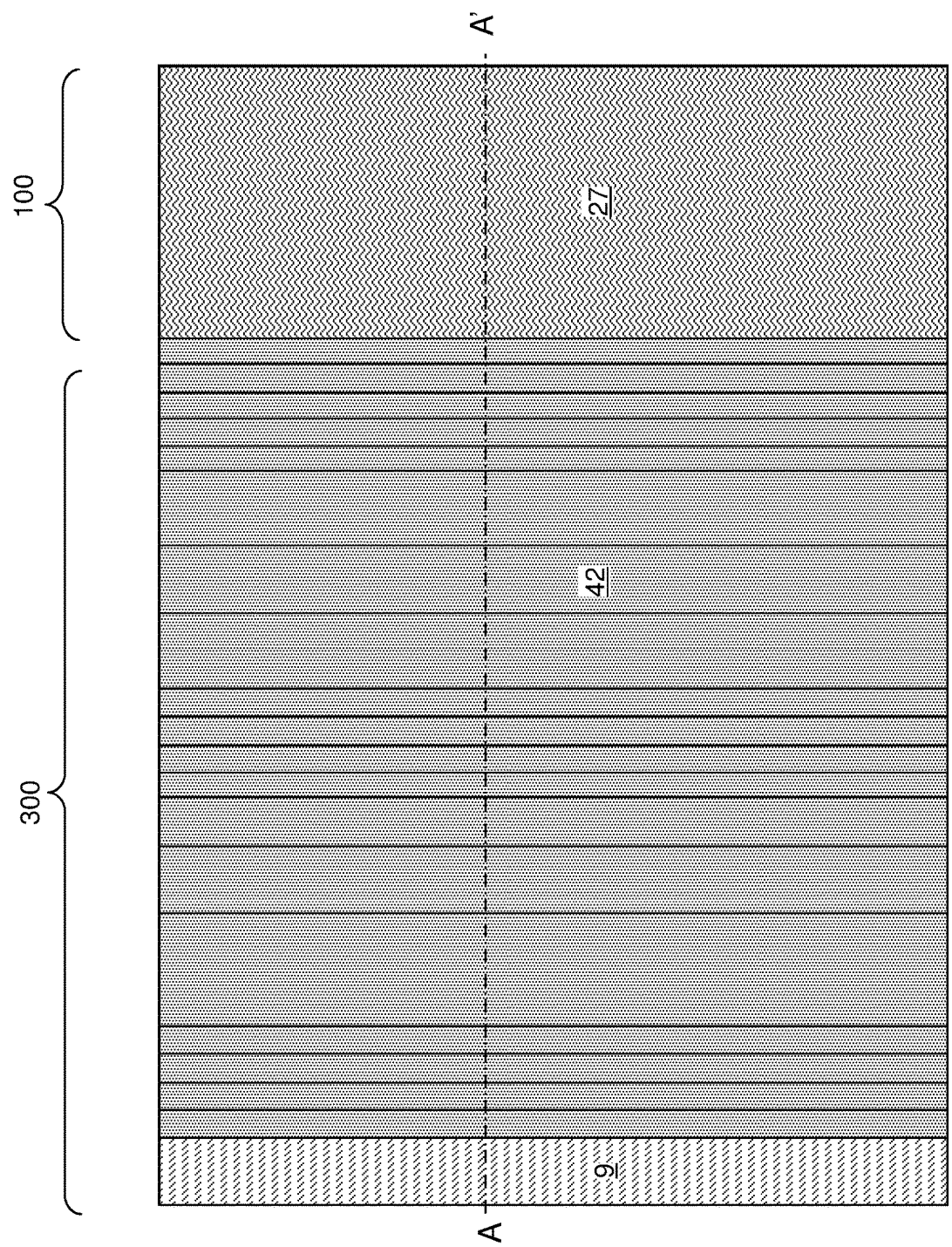
FIG. 12B is a top-down view of the first exemplary structure of FIG. 12A. The vertical plane A-A' is the plane of the cross-section for FIG. 12A.

Referring to FIGS. 12A and 12B, the trimming mask layer 27 is trimmed by an intra-staircase trimming distance, and an anisotropic etch process is performed to remove each topmost insulating layer 32 that is physically exposed in the staircase regions (30A, 30B, 30C). A spacer material layer 42 can be provided as a topmost layer within each step area (i.e., an area between a neighboring pair of vertical steps). Each stet of stepped surfaces within a respective staircase region (30A, 30B, 30C) can be laterally spaced among one another by a tapered layer region (31A, 31B) formed by a respective subset of layers within the alternating stack (32, 42) that is less than the entire set of layers within the alternating stack (32, 42). Each tapered layer region (31A, 31B) has a reverse taper that is the opposite type of taper that the stepped surfaces of the staircase regions (30A, 30B, 30C) provide. Specifically, each tapered layer region (31A, 31B) has sidewalls of a respective subset of layers in the alternating stack (32, 42) having an increased distance from the back side surface 5 of the substrate with a lateral distance from the memory array region 100.

Figure 13:
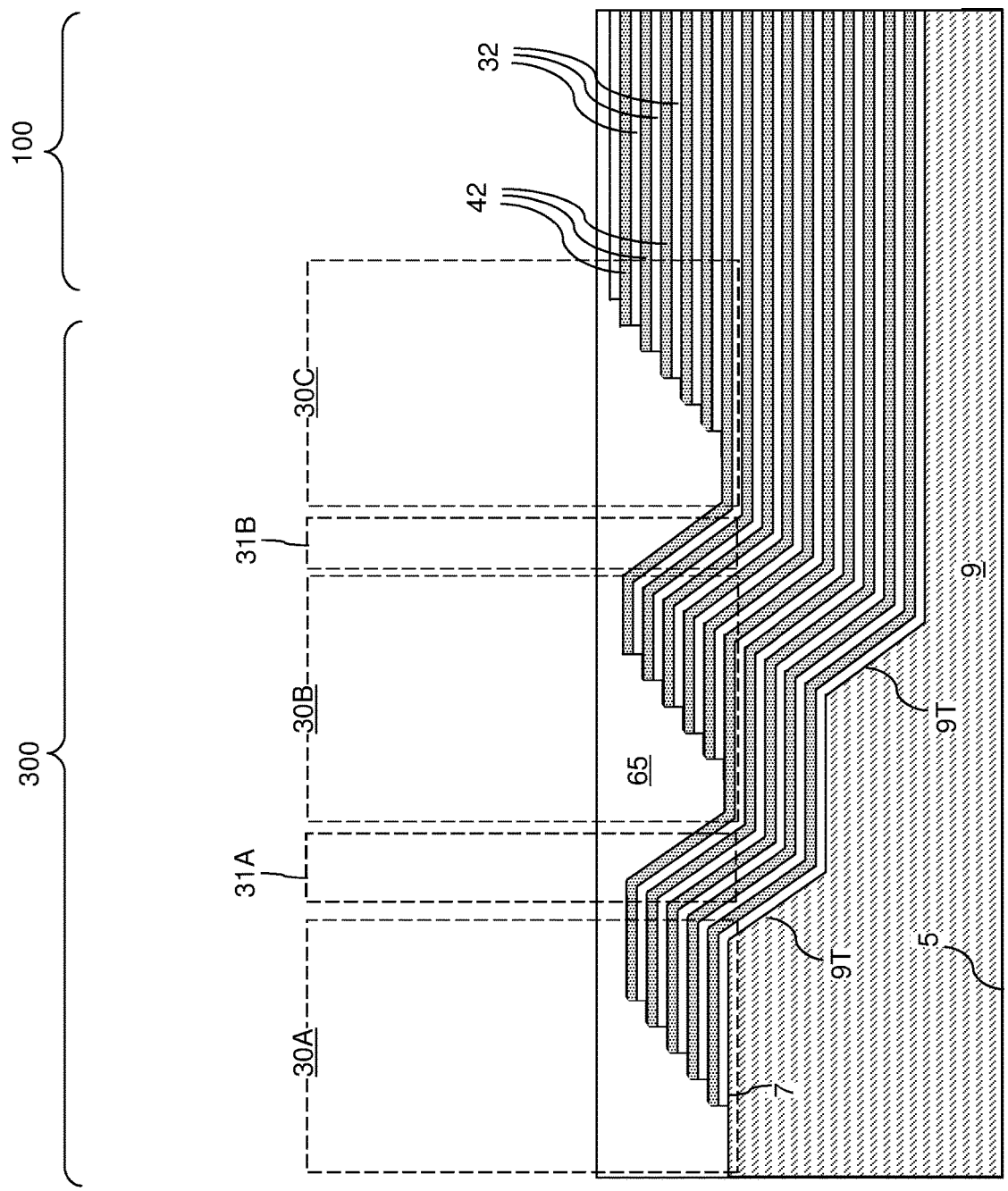
FIG. 13 is a schematic vertical cross-sectional view of the first exemplary structure after formation of a retro-stepped dielectric material portion according to the first embodiment of the present disclosure.

Referring to FIG. 13, the trimming mask layer 27 can be removed, for example, by ashing. A plurality of stepped cavities is formed over the plurality of stepped surfaces of the staircase regions (30A, 30B, 30C) and the tapered surfaces of the tapered layer regions (31A, 31B). Each stepped cavity overlies a respective one of the stepped surfaces of a staircase region (30A, 30B, 30C) and a physically exposed tapered surface (i.e., a slanted surface) of a respective one of the tapered layer regions (31A, 31B). As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

The plurality of stepped cavities is formed within the contact region 300 which is located between the memory array region 100 and the peripheral region 200. Each stepped cavity can have stepped surfaces such that the horizontal cross-sectional shape of the stepped cavity changes in steps as a function of the vertical distance from the back side surface 5 of the substrate semiconductor layer 9. The stepped surfaces can laterally extend along a horizontal direction that is perpendicular to the direction connecting the memory array region 100 and the peripheral device region 200. In this case, the staircase regions (30A, 30B, 30C) are referred to as terrace regions, i.e., regions that include terraces that laterally extend along a horizontal direction.

A planarizable dielectric material such as silicon oxide can be deposited in the plurality of stepped cavities and in the memory array region 100, and can be subsequently planarized to provide a horizontal top surface. A dielectric material portion continuously extending over the plurality of staircase regions (30A, 30B, 30C) is formed. The dielectric material portion includes a plurality of retro-stepped surfaces, i.e., stepped surfaces that decreases the lateral extent of the dielectric material portion with vertical proximity to the back side surface 5 of the substrate, and is herein referred to as a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present.

The retro-stepped dielectric material portion 65 includes a plurality of retro-stepped bottom surfaces contacting a respective stepped surface in a respective one of the plurality of staircase regions (30A, 30B, 30C), and at least one tapered bottom surface contacting a respective tapered surface of the tapered layer regions (31A, 31B) of the alternating stack (32, 42) and located between a neighboring pair of staircase regions (30A, 30B, 30C) among the plurality of staircase regions (30A, 30B, 30C). If silicon oxide is employed for the retro-stepped dielectric material portion 65, the silicon oxide of the retro-stepped dielectric material portion 65 may, or may not, be doped with dopants such as B, P, and/or F.

Figure 14A:
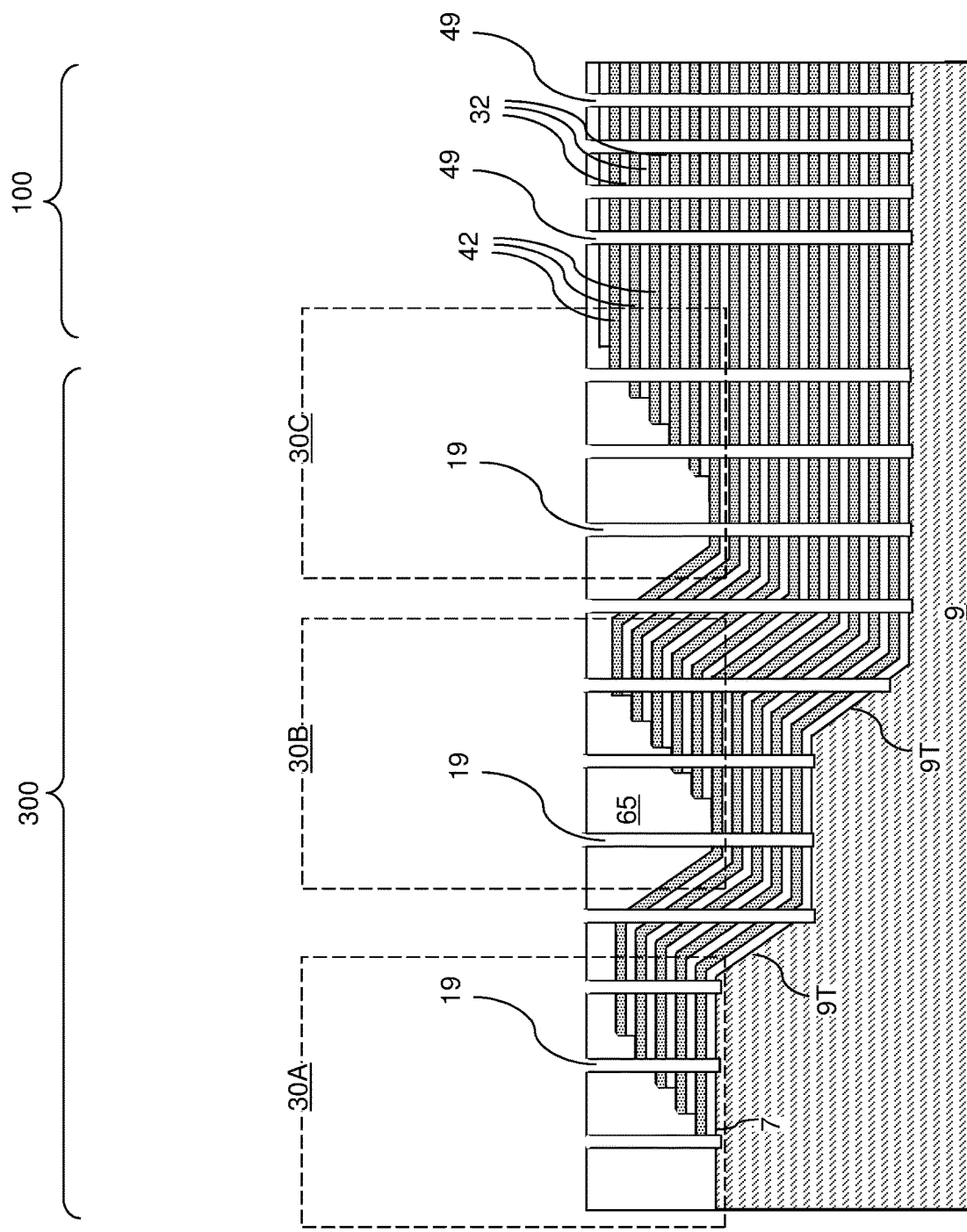
FIG. 14A is a schematic vertical cross-sectional view of the first exemplary structure after formation of memory openings and support openings according to the first embodiment of the present disclosure.
Figure 14B:
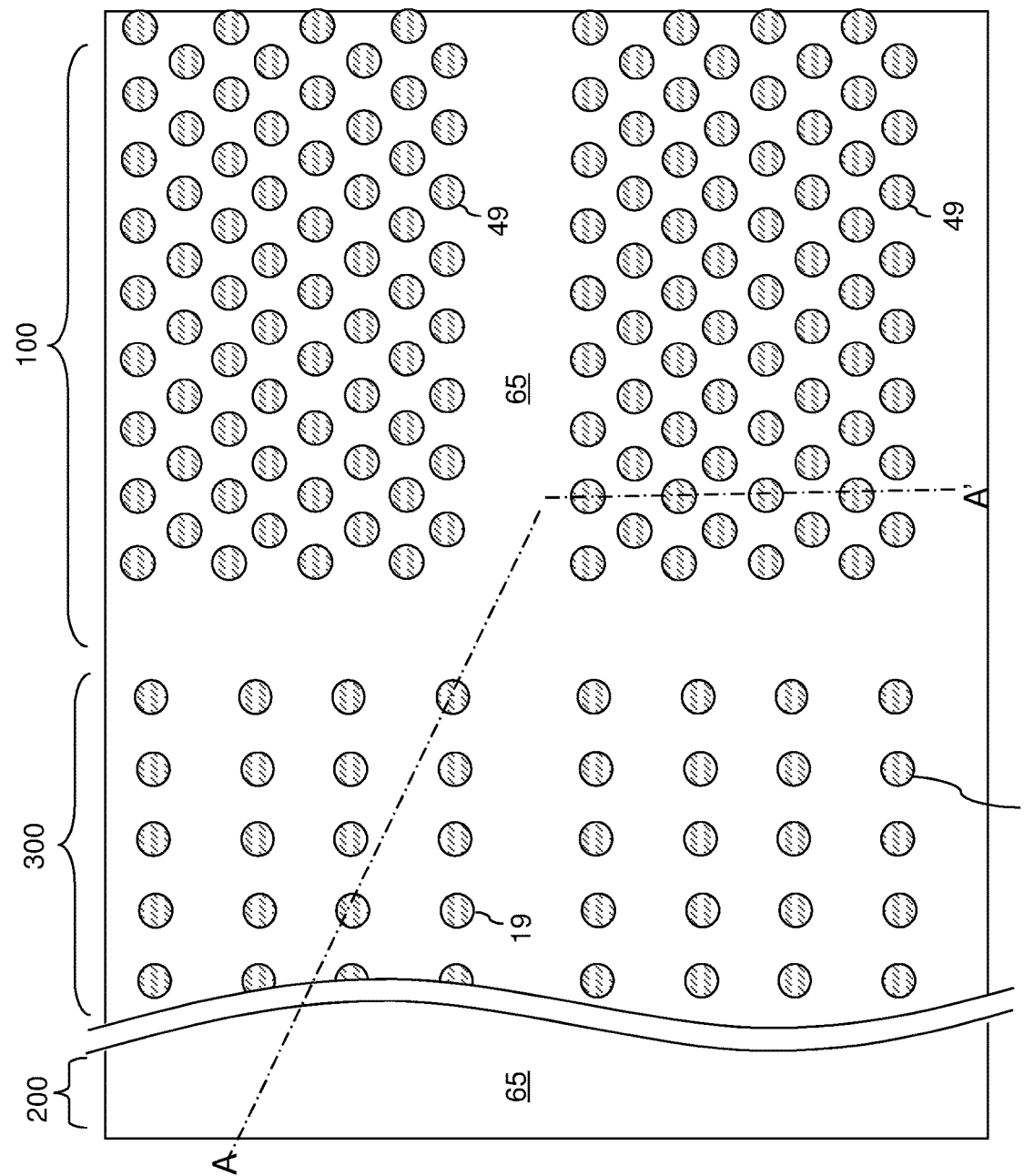
FIG. 14B is a top-down view of the first exemplary structure of FIG. 12A. The vertical plane A-A' is the plane of the cross-section for FIG. 14A.

Referring to FIGS. 14A and 14B, a lithographic material stack (not shown) including at least a photoresist layer can be formed over the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the retro-stepped dielectric material portion 65 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the retro-stepped dielectric material portion 65 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the substrate semiconductor layer 9. In one embodiment, an overetch into the substrate semiconductor layer 9 may be optionally performed after the top surface of the substrate semiconductor layer 9 is physically exposed at a bottom of each memory opening 49 and each support opening 19. The overetch may be performed prior to, or after, removal of the lithographic material stack. In other words, the recessed surfaces of the substrate semiconductor layer 9 may be vertically offset from the un-recessed top surfaces of the substrate semiconductor layer 9 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the substrate semiconductor layer 9.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

FIGS. 15A-15H illustrate structural changes in a memory opening 49, which is one of the memory openings 49 in the exemplary structure of FIGS. 14A and 14B. The same structural change occurs simultaneously in each of the other memory openings 49 and in each support opening 19.

Referring to FIG. 15A, a memory opening 49 in the exemplary device structure of FIGS. 14A and 14B is illustrated. The memory opening 49 extends through the retro-stepped dielectric material portion 65, the alternating stack (32, 42), and optionally into an upper portion of the substrate semiconductor layer 9. At this processing step, each support opening 19 can extend through the retro-stepped dielectric material portion 65, a subset of layers in the alternating stack (32, 42), and optionally through the upper portion of the substrate semiconductor layer 9. The recess depth of the bottom surface of each memory opening with respect to the top surface of the substrate semiconductor layer 9 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 15B, an optional pedestal channel portion (which may be an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the substrate semiconductor layer 9. In one embodiment, the pedestal channel portion 11 can be doped with electrical dopants of the same conductivity type as the substrate semiconductor layer 9. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate semiconductor layer 9 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the substrate semiconductor layer 9 that the pedestal channel portion contacts.

Referring to FIG. 15C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 15D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the retro-stepped dielectric material portion 65 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the substrate semiconductor layer 9 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 15E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 15F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 15G, the horizontal portion of the dielectric core layer 62L can be removed, for example, by a recess etch from above the top surface of the retro-stepped dielectric material portion 65. Each remaining portion of the dielectric core layer 62L constitutes a dielectric core 62. Further, the horizontal portion of the second semiconductor channel layer 602 located above the top surface of the retro-stepped dielectric material portion 65 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 15H, the top surface of each dielectric core 62 can be further recessed within each memory opening, for example, by a recess etch to a depth that is located between the top surface of the retro-stepped dielectric material portion 65 and the bottom surface of the retro-stepped dielectric material portion 65. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the retro-stepped dielectric material portion 65, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20, which is illustrated in FIG. 16.

Each of the support pillar structures 20 includes a dummy memory film and a dummy semiconductor channel. The dummy memory film and the memory film 50 can have a same layer composition. Each component layer in the dummy memory film can have the same composition and the same thickness as a corresponding component layer within the memory film 50. The dummy semiconductor channel and the vertical semiconductor channel 60 can have a same material composition. Each component layer in the dummy semiconductor channel can have the same composition and the same thickness as a corresponding component layer within the vertical semiconductor channel 70.

Figure 16:
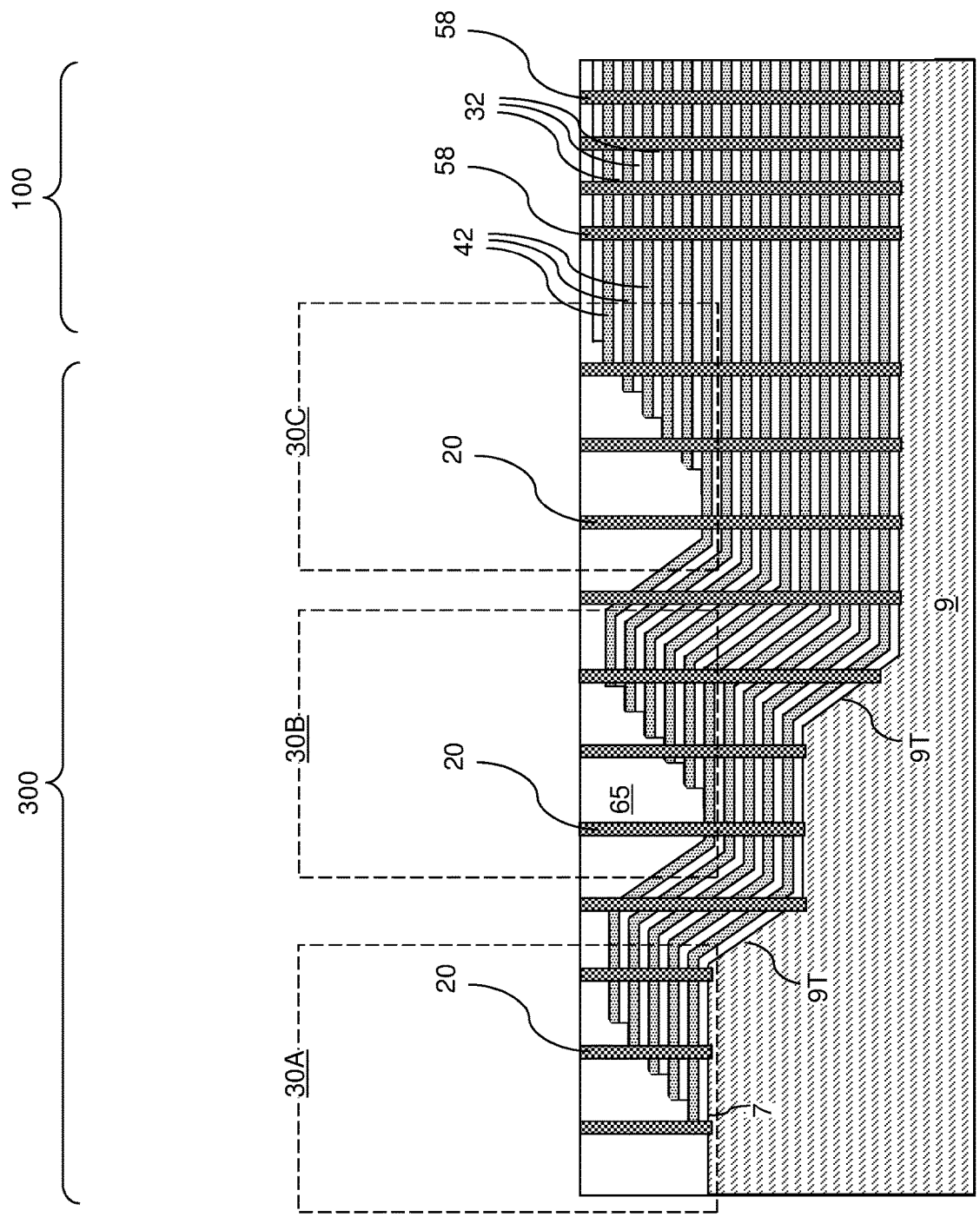
FIG. 16 is a schematic vertical cross-sectional view of the first exemplary structure after formation of memory stack structures and support pillar structures according to the first embodiment of the present disclosure.

Referring to FIG. 16, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 14A and 14B. An instance of the support pillar structure 20 can be formed within each support opening 19 of the structure of FIGS. 14A and 14B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 17A:
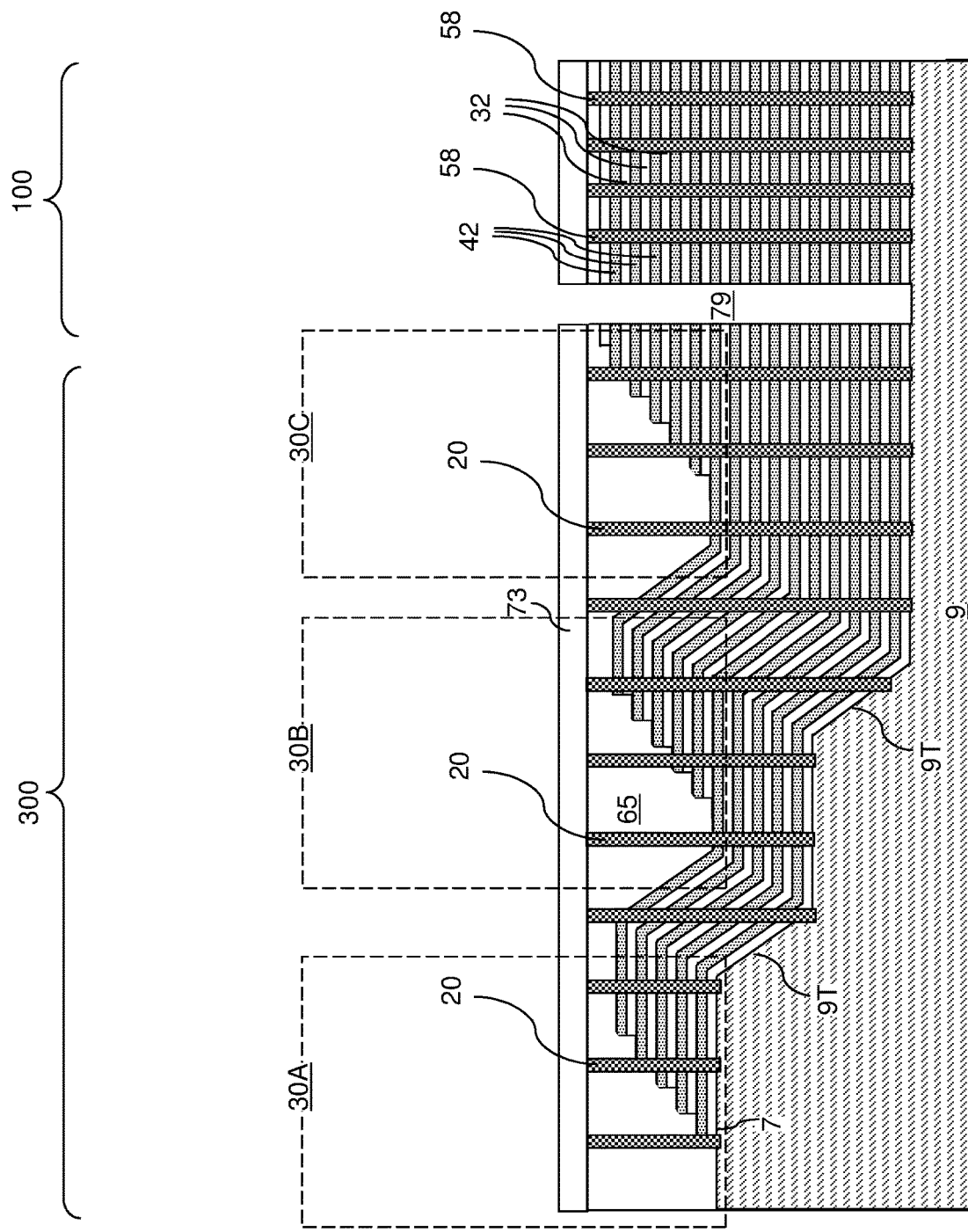
FIG. 17A is a schematic vertical cross-sectional view of the first exemplary structure after formation of backside trenches according to the first embodiment of the present disclosure.
Figure 17B:
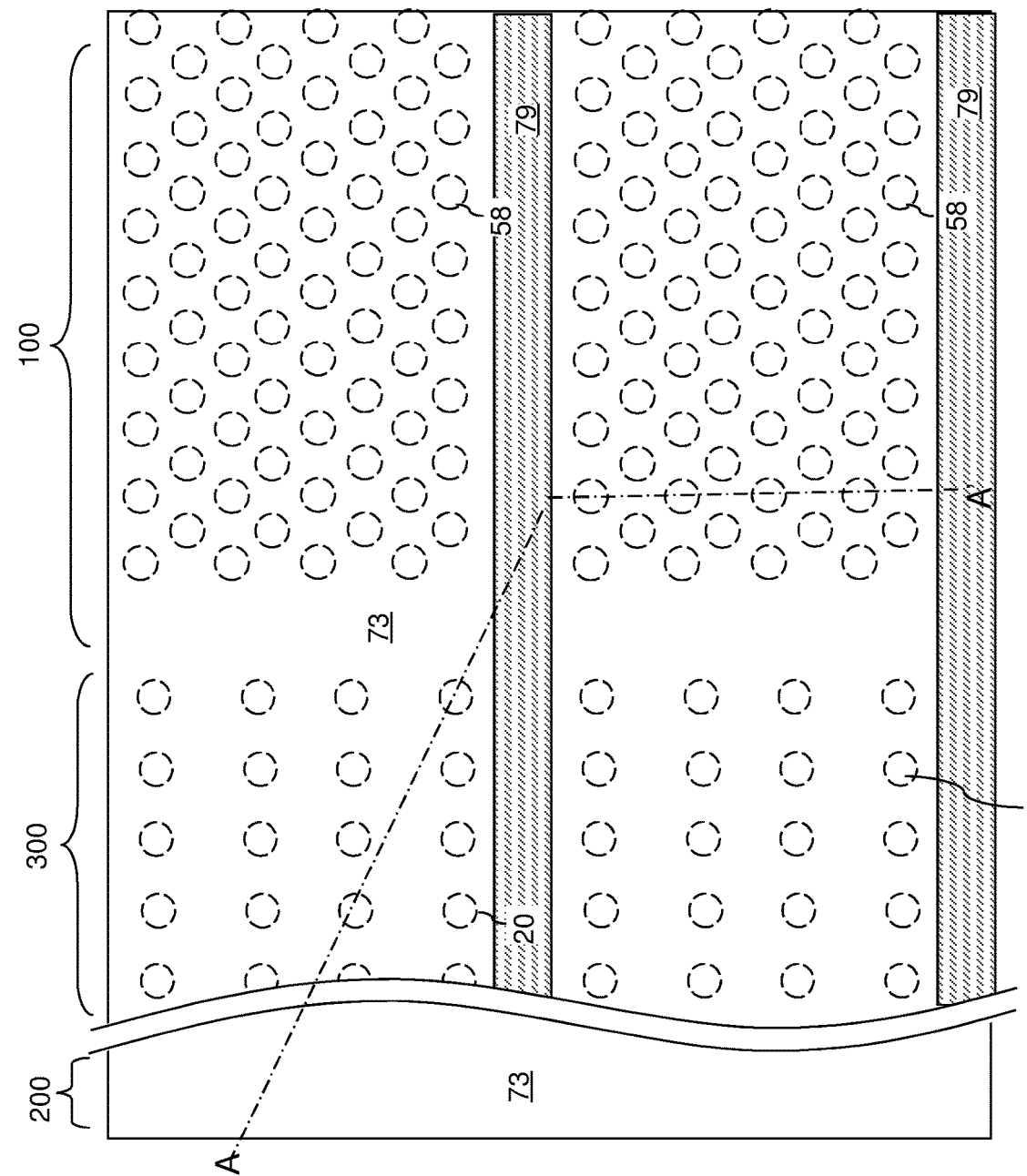
FIG. 17B is a top-down view of the first exemplary structure of FIG. 17A. The vertical plane A-A' is the plane of the schematic vertical cross-sectional view of FIG. 17A.

Referring to FIGS. 17A and 17B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate semiconductor layer 9, and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 18:
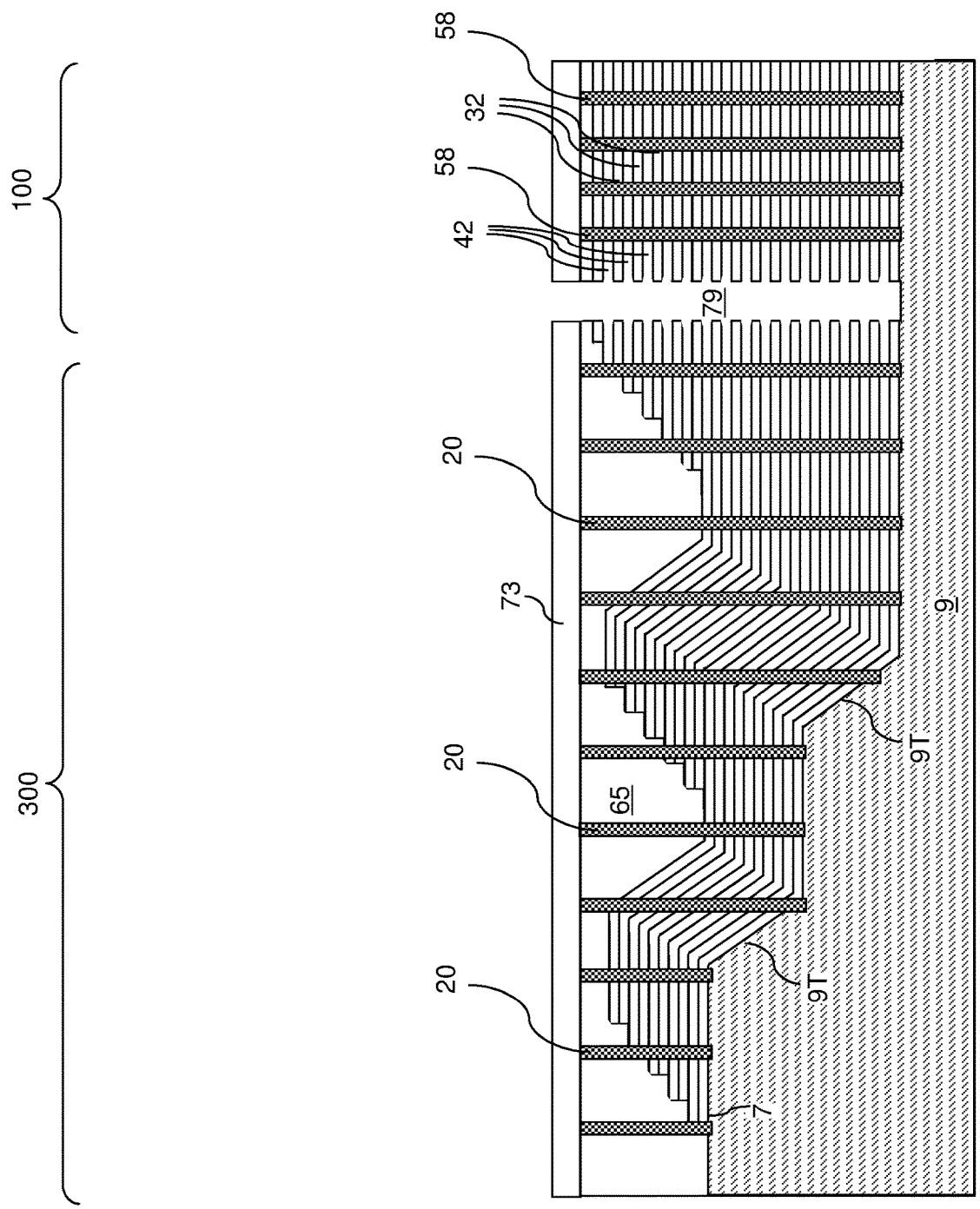
FIG. 18 is a schematic vertical cross-sectional view of the first exemplary structure after formation of backside recesses according to the first embodiment of the present disclosure.

Referring to FIG. 18, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the substrate semiconductor layer 9, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate semiconductor layer 9. In this case, each backside recess 43 can define a space for receiving a respective word line of the array of monolithic three-dimensional NAND strings.

Each of the plurality of backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the substrate semiconductor layer 9 can be converted into dielectric material portions by thermal conversion and/or plasma conversion of the semiconductor materials into dielectric materials.

Figure 19:
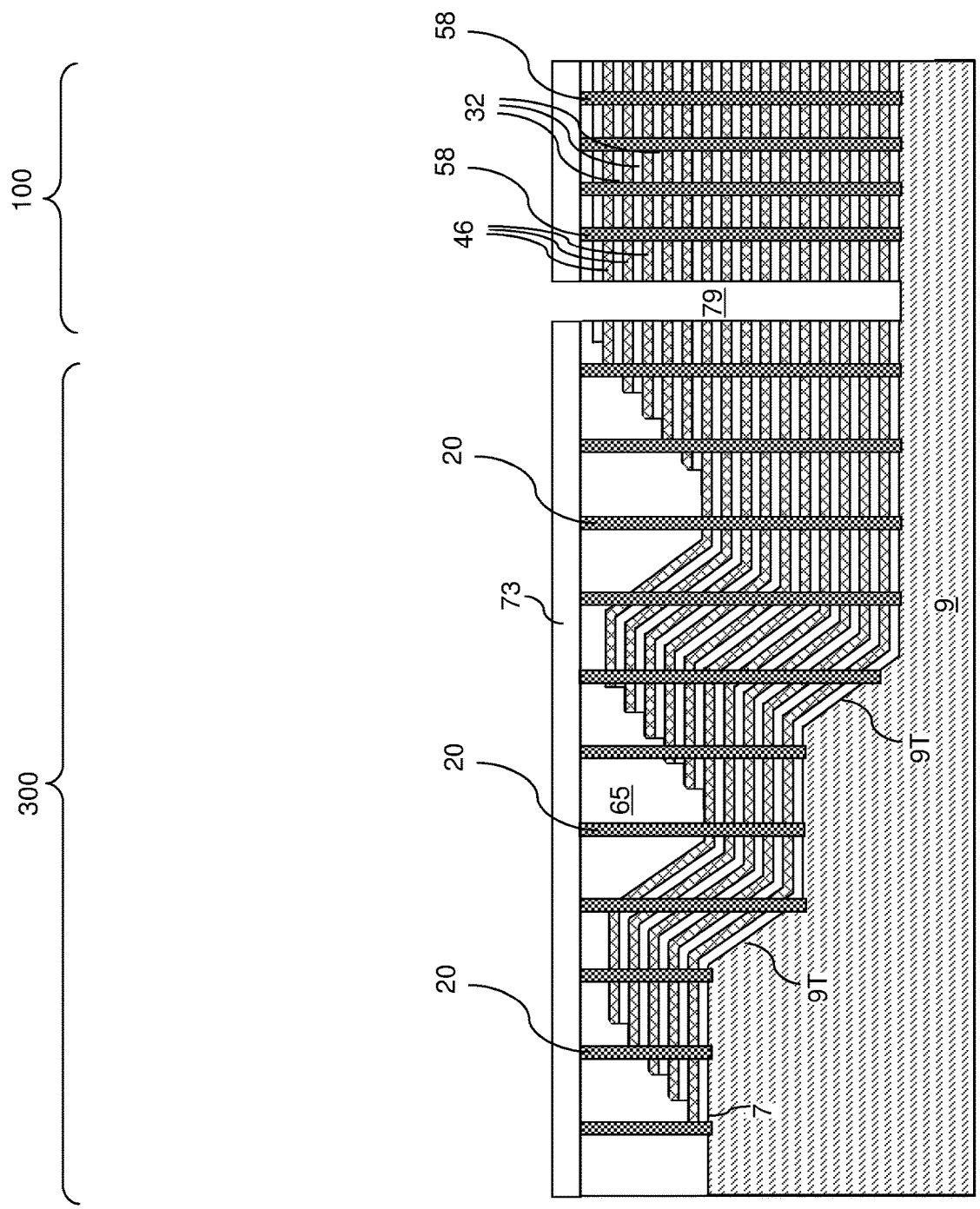
FIG. 19 is a schematic vertical cross-sectional view of the first exemplary structure after formation of electrically conductive layers in the backside recesses and removal of a deposited conductive material from within the backside trenches according to the first embodiment of the present disclosure.

Referring to FIG. 19, a backside blocking dielectric layer (not expressly shown) can be optionally formed. The backside blocking dielectric layer, if present, comprises a dielectric material that functions as a control gate dielectric for the control gates to be subsequently formed in the backside recesses 43.

At least one metallic material can be subsequently deposited in the remaining volumes of the backside recesses 43. For example, a combination of a metallic barrier layer and a metal fill material can be deposited in the backside recesses 43. The metallic barrier layer can include an electrically conductive metallic material that can function as a diffusion barrier layer and/or adhesion promotion layer for a metallic fill material to be subsequently deposited. For example, the metallic barrier layer can include a conductive metallic nitride material such as TiN, TaN, WN, or a stack thereof, or can include a conductive metallic carbide material such as TiC, TaC, WC, or a stack thereof. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact level dielectric layer 73. Thus, each sacrificial material layer 42 can be replaced with an electrically conductive layer 46.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 20:
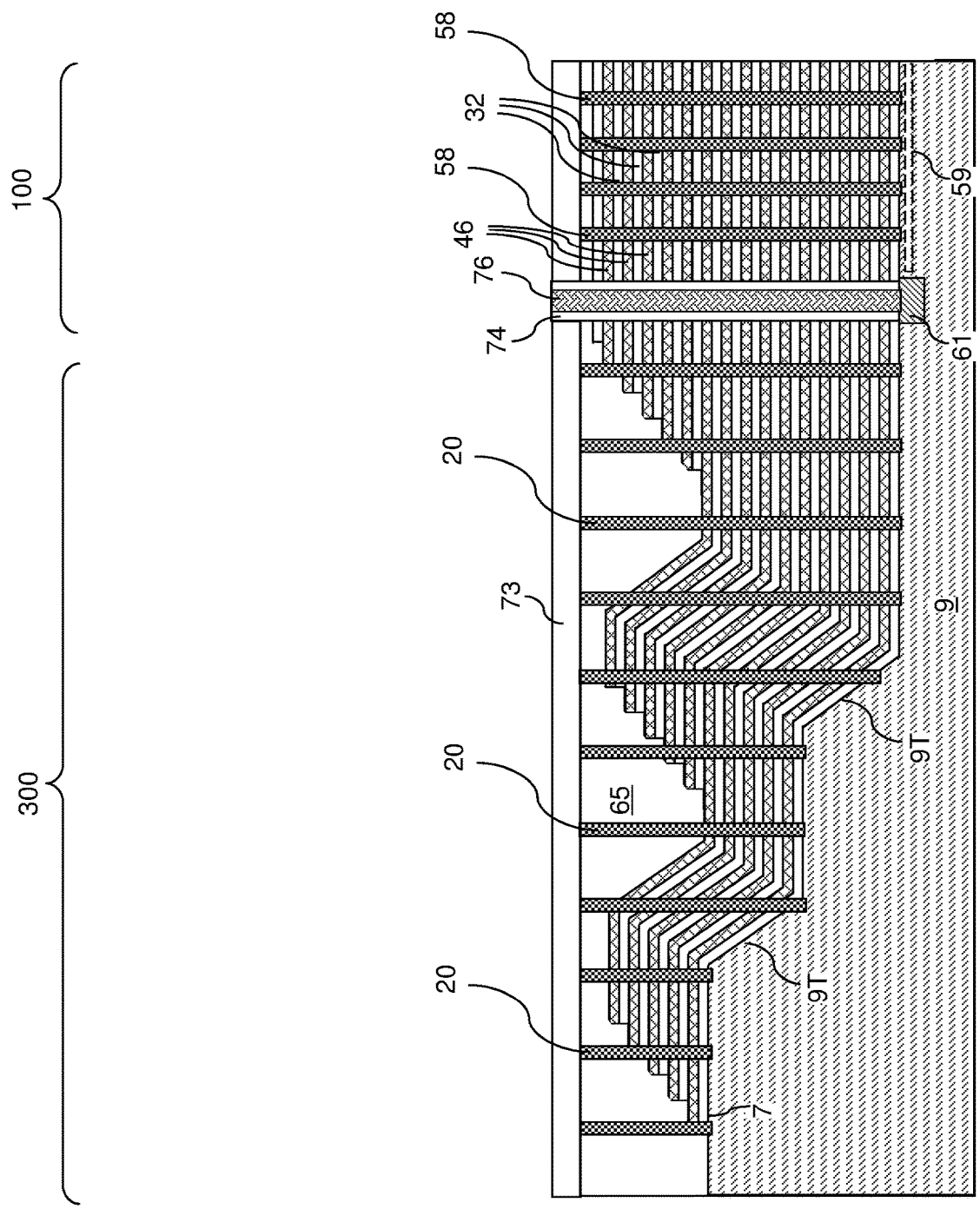
FIG. 20 is a schematic vertical cross-sectional view of the first exemplary structure after formation of an insulating spacer and a backside contact structure within each backside trench according to the first embodiment of the present disclosure.

Referring to FIG. 20, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer is present, the insulating material layer can be formed directly on surfaces of the backside blocking dielectric layer and directly on the sidewalls of the electrically conductive layers 46. If a backside blocking dielectric layer is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the substrate semiconductor layer 9 can be physically exposed at the bottom of each backside trench 79.

A source region 61 can be formed at a surface portion of the substrate semiconductor layer 9 under each backside cavity by implantation of electrical dopants into physically exposed surface portions of the substrate semiconductor layer 9. Each source region 61 is formed in a surface portion of the substrate semiconductor layer 9 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the substrate semiconductor layer 9 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate semiconductor layer 9. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer is employed, the backside contact via structure 76 can contact a sidewall of the backside blocking dielectric layer.

Figure 21A:
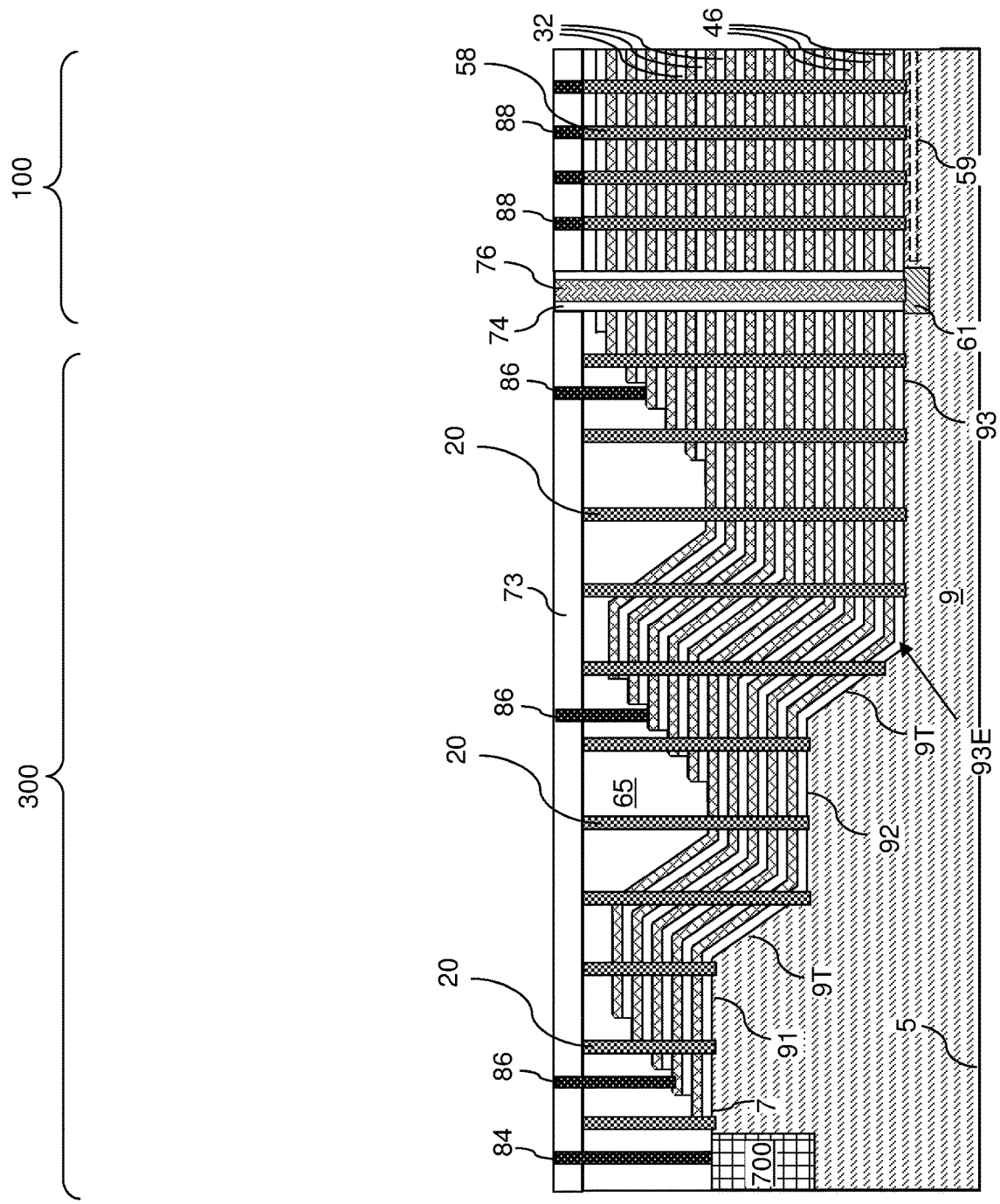
FIG. 21A is a schematic vertical cross-sectional view of the first exemplary structure after formation of word line contact via structures and array contact via structures according to the first embodiment of the present disclosure.
Figure 21B:
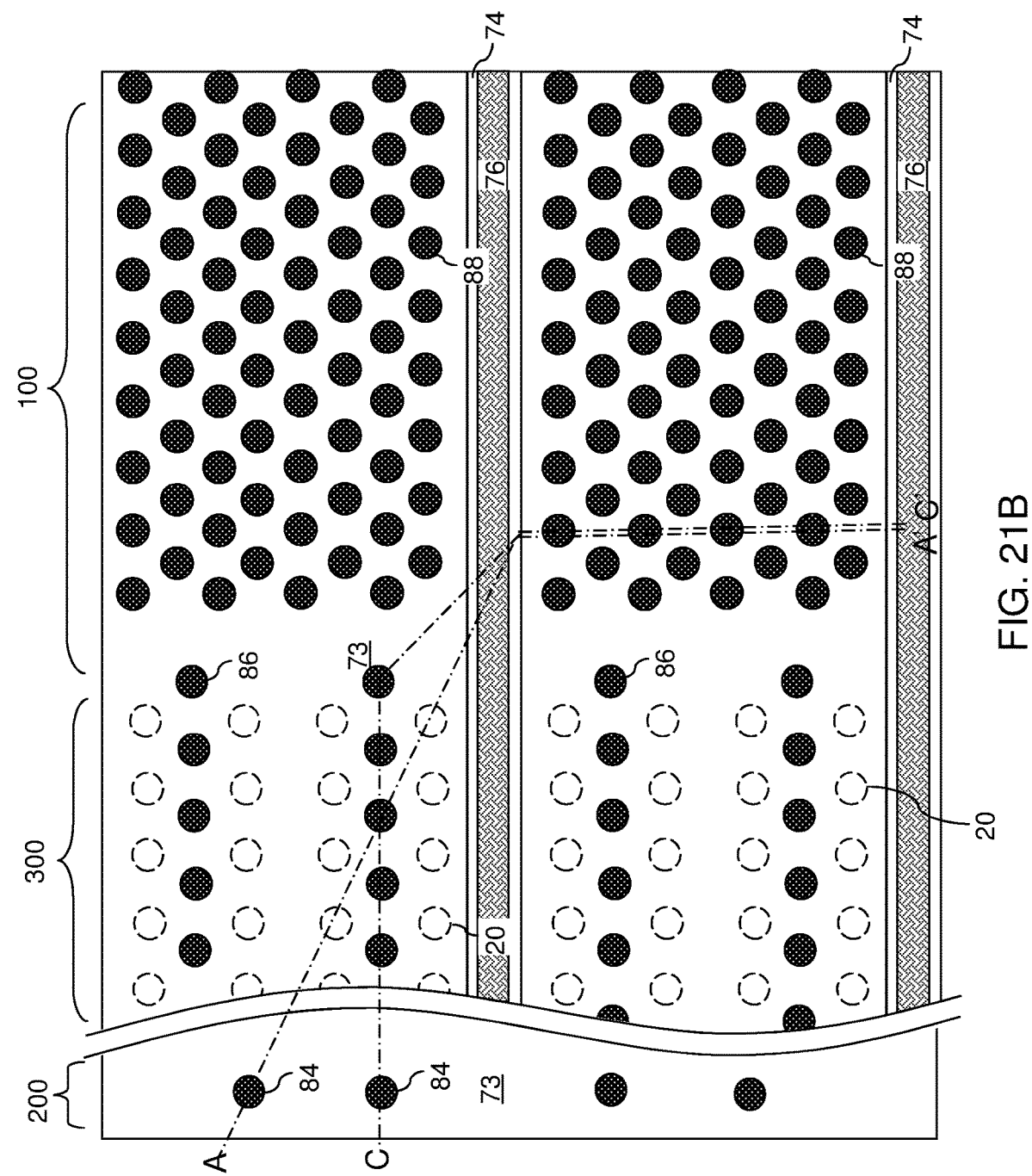
FIG. 21B is a top-down view of the first exemplary structure of FIG. 21A. The vertical plane A-A' is the plane of the schematic vertical cross-sectional view of FIG. 21A.
Figure 21C:
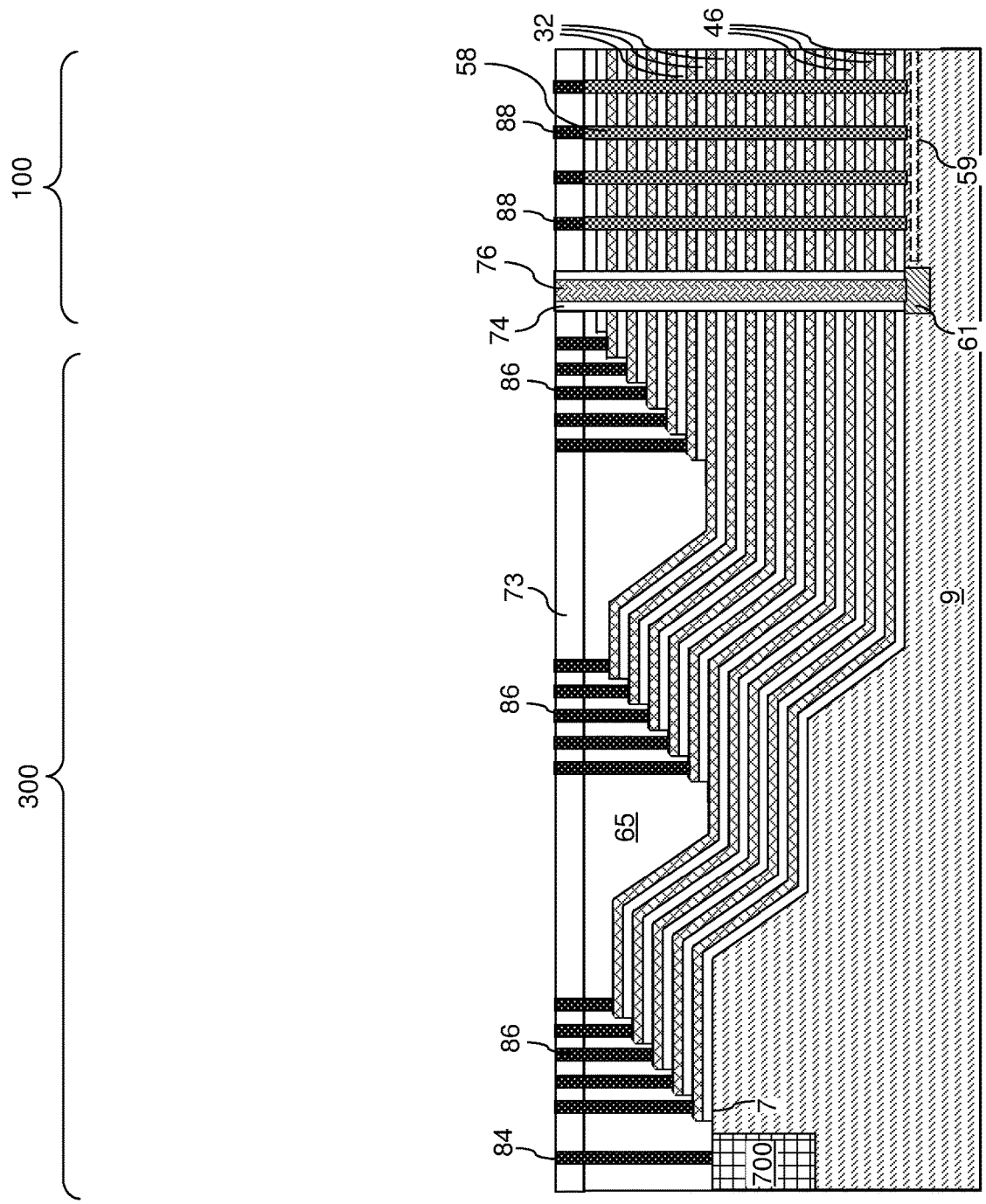
FIG. 21C is a schematic vertical cross-sectional view of the first exemplary structure along the vertical plane C-C' in FIG. 21B.

Referring to FIGS. 21A-21C, additional contact via structures (88, 86) can be formed through the contact level dielectric layer 73 and the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 84 can be formed through the retro-stepped dielectric material portion 65 directly on respective nodes of the peripheral devices 700. The openings through the retro-stepped dielectric material portion 65 for the peripheral device contact via structures 84 and the word line contact via structures 86 can be formed during the same etching step since the height difference between the top and bottom electrically conductive layers 46 in each terrace region in the contact region 300 is reduced and the depth of the openings for the peripheral device contact via structures 84 and the word line contact via structures 86 can be of the same order of magnitude. The electrically conductive material of the peripheral device contact via structures 84 and the word line contact via structures 86 can be formed in the respective openings at the same time (e.g., during the same metal deposition step), which reduces the total number of processing steps.

The word line contact via structures 86 are a set of contact via structures formed on the electrically conductive layers 46. Each of the electrically conductive layers 46 can be contacted by a respective one among the set of contact via structures. The total height variation within the set of contact via structures is equal to, or less than, one half of an entire height of the alternating stack (32, 46). In one embodiment, the total height variation within the set of contact via structures (i.e., within the entire set of the word line contact via structures 86) can be about 1/n times the total thickness of the alternating stack (32, 46) in the memory array region 100.

Referring to FIG. 22, a second exemplary structure according to a second embodiment of the present disclosure can be derived from the first exemplary structure of FIG. 5 by removing the second photoresist layer 117B and the second dielectric pad layer 12B. Subsequently, a silicon oxide pad layer 12 and an oxygen diffusion barrier layer 14 can be sequentially formed on the horizontal top surfaces and the tapered sidewalls 9T of the substrate semiconductor layer 9. The silicon oxide pad layer 12 can be formed by thermal oxidation of surface portions of the substrate semiconductor layer 9 and/or by deposition of a conformal silicon oxide layer. The thickness of the silicon oxide pad layer 12 can be in a range from 3 nm to 60 nm, although lesser and greater thicknesses can also be employed. The oxygen diffusion barrier layer 14 includes a material that blocks diffusion of oxygen therethrough. For example, the oxygen diffusion barrier layer 14 can include silicon nitride. The oxygen diffusion barrier layer 14 can be deposited, for example, by chemical vapor deposition process. The thickness of the oxygen diffusion barrier layer 14 can be in a range from 10 nm to 100 nm, although lesser and greater thicknesses can also be employed.

Figure 23:
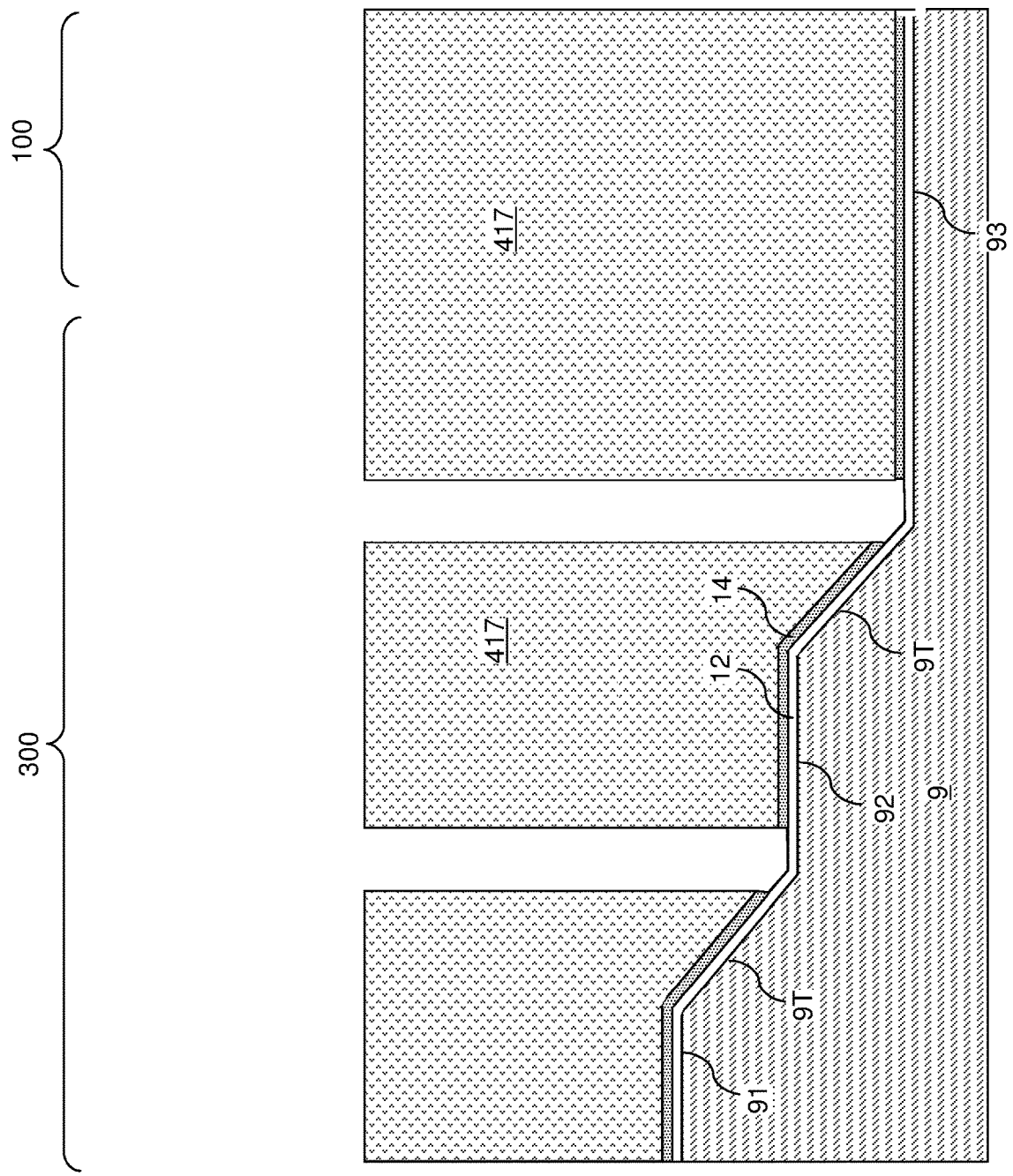
FIG. 23 is a schematic vertical cross-sectional view of the second exemplary structure after patterning the oxygen diffusion barrier layer according to the second embodiment of the present disclosure.

Referring to FIG. 23, a photoresist layer 417 can be applied over the oxygen diffusion barrier layer 14, and can be lithographically patterned to form slit shaped openings in each region at which a bottom edge of a tapered sidewall 9T of the substrate semiconductor layer 9 adjoins an edge of a horizontal top surface (91, 92, 93) of the substrate semiconductor layer 9. Each opening in the photoresist layer 417 can laterally extend along a direction that is perpendicular to the horizontal direction connecting the memory array region 100 and the peripheral device region 200 (i.e., along a direction that is perpendicular to the vertical cross-sectional plane of the view of FIG. 23). The oxygen diffusion barrier layer 14 can be patterned by an anisotropic etch process or an isotropic etch process that employs the patterned photoresist layer 417 as an etch mask. The silicon oxide pad layer 12 can be employed as an etch stop layer for the anisotropic or isotropic etch process that patterns the oxygen diffusion barrier layer 14. The patterned photoresist layer 417 is then removed.

Figure 24:
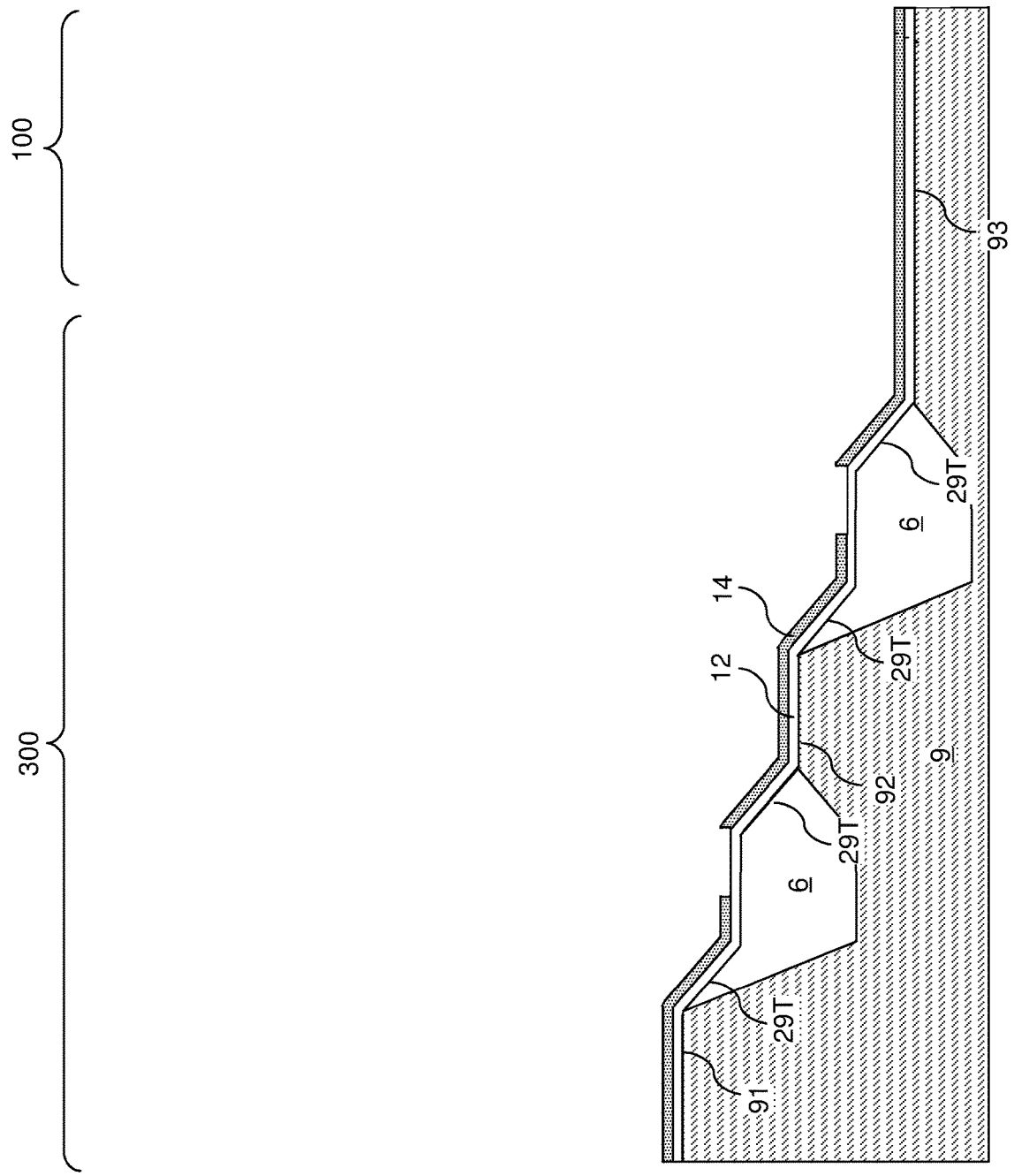
FIG. 24 is a schematic vertical cross-sectional view of the second exemplary structure after formation of silicon oxide portions by thermal oxidation according to the second embodiment of the present disclosure.

Referring to FIG. 24, silicon oxide portions 6 can be formed by thermal oxidation of surface portions of the substrate semiconductor layer 9 that underlie the openings in the oxygen diffusion barrier layer 14 (e.g., the silicon oxide portions 6 can be formed by the LOCOS process). Each silicon oxide portion 6 can be formed in a surface region of the substrate. Each silicon oxide portion 6 can include a portion having a horizontal top surface, a lower end portion including a lower tapered sidewall 29T that extends downward from the horizontal top surface, and an upper tapered sidewall 29T that extends upward from the horizontal top surface. The duration of the thermal oxidation process can be selected such that each horizontal top surface of the silicon oxide portions 6 is provided at about midway between a neighboring pair of horizontal semiconductor surfaces, which are remaining portions of the horizontal top surfaces (91, 92, 93).

Figure 25:
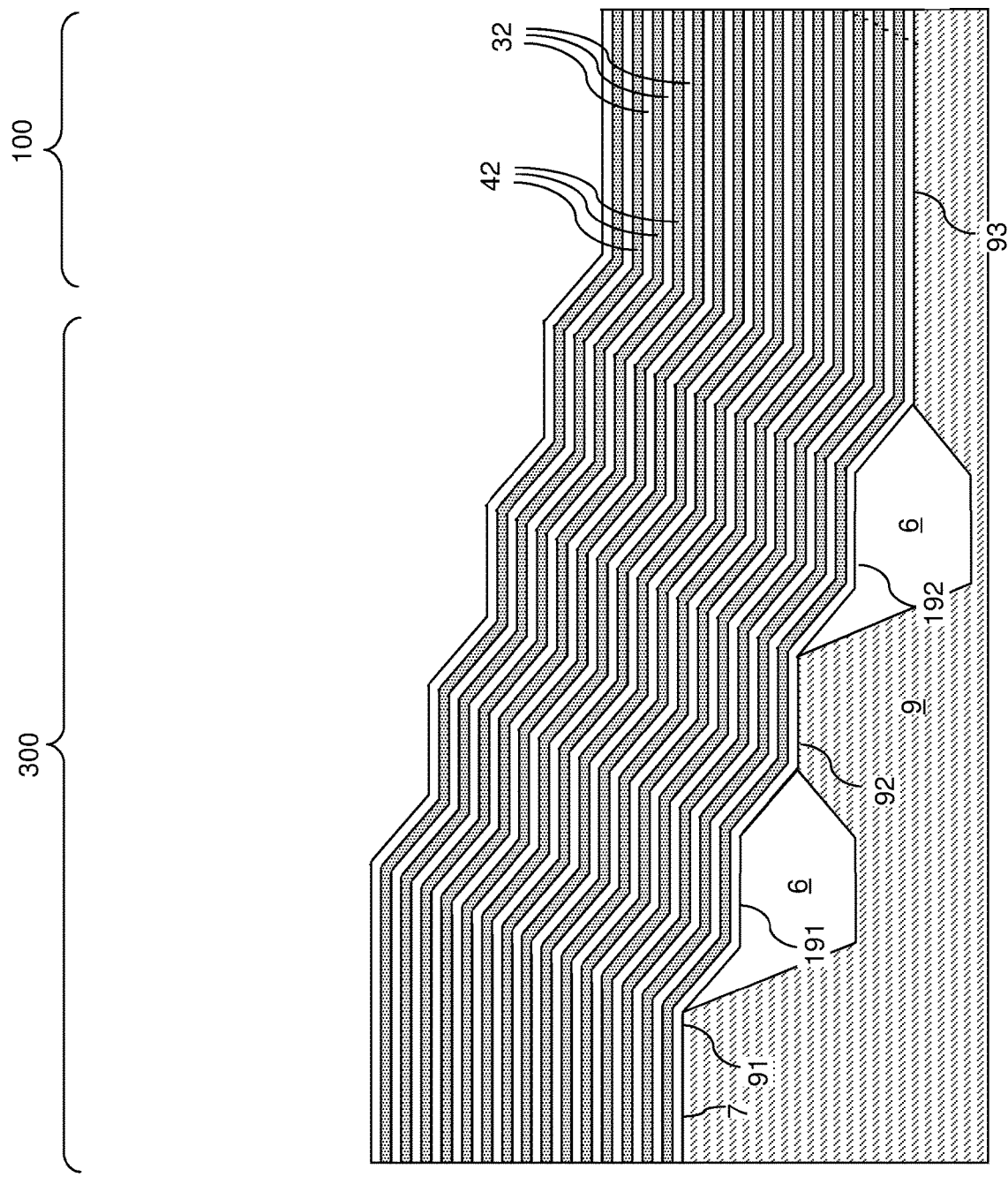
FIG. 25 is a schematic vertical cross-sectional view of the second exemplary structure after formation of an alternating stack of insulating layers and spacer material layers according to the second embodiment of the present disclosure.

Referring to FIG. 25, the oxygen diffusion barrier layer 14 can be removed selective to the silicon oxide pad layer 12. For example, if the oxygen diffusion barrier layer 14 includes silicon nitride, the oxygen diffusion barrier layer 14 can be removed selective to the silicon oxide pad layer 12 by a wet etch employing hot phosphoric acid. Subsequently, the silicon oxide pad layer 12 can be removed, for example, by a wet etch employing dilute hydrofluoric acid. The duration of the wet etch process can be controlled to prevent significant overetch into the silicon oxide portions 6. A plurality of horizontal top surfaces (91, 92, 93, 191, 192) of the substrate includes top surfaces (91, 92, 93) of the substrate semiconductor layer 9 and a top surface (191, 192) of each of the at least one semiconductor oxide portion 6.

Subsequently, the processing steps of FIG. 6 can be performed to form an alternating stack of insulating layers 32 and spacer material layers 42.

Figure 26:
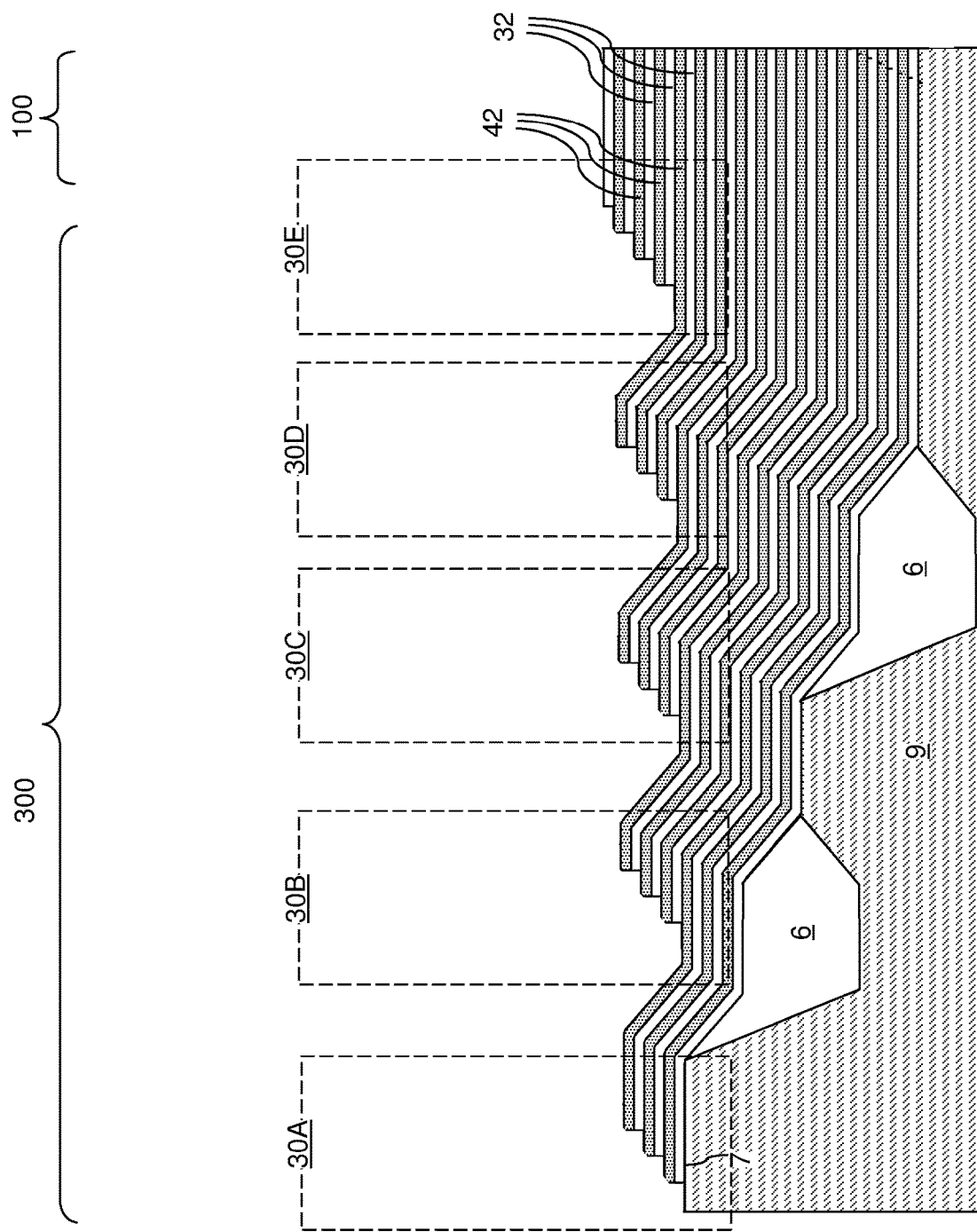
FIG. 26 is a schematic vertical cross-sectional view of the second exemplary structure after formation of multiple sets of stepped surfaces over multiple staircase regions according to the second embodiment of the present disclosure.

Referring to FIG. 26, the processing steps of FIGS. 7, 8, 9, 10, 11, 12A, and 12B can be performed to form a plurality of staircase regions (30A, 30B, 30C, 30D, 30E). The number of vertical steps within each of the plurality of staircase regions (30A, 30B, 30C, 30D, 30E) can be about N/n, in which N is the total number of the spacer material layers and n is the total number of the staircase regions. In one embodiment, the number of vertical steps within each of the plurality of staircase regions (30A, 30B, 30C, 30D, 30E) can be in a range from [N/n−3] to [N/n+2] in which the symbol [ ] refers to a truncation operation that retains only an integer value of the operand therein and truncates all digits below the decimal point. Subsequently, the trimming material layer can be removed, for example, by ashing.

Figure 27:
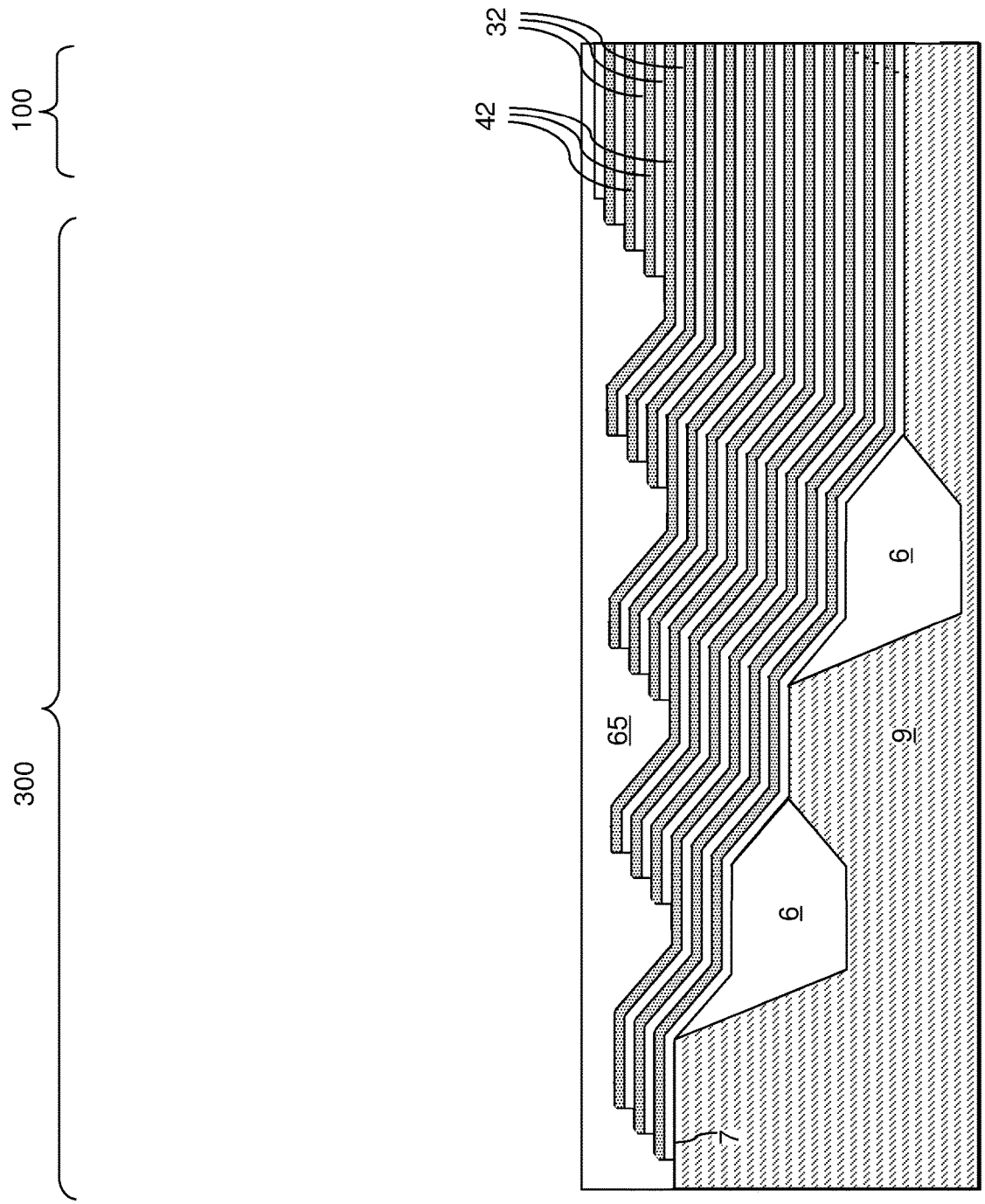
FIG. 27 is a schematic vertical cross-sectional view of the second exemplary structure after formation of a retro-stepped dielectric material portion according to the second embodiment of the present disclosure.

Referring to FIG. 27, the processing steps of FIG. 13 can be performed to form a retro-stepped dielectric material portion 65.

Figure 28A:
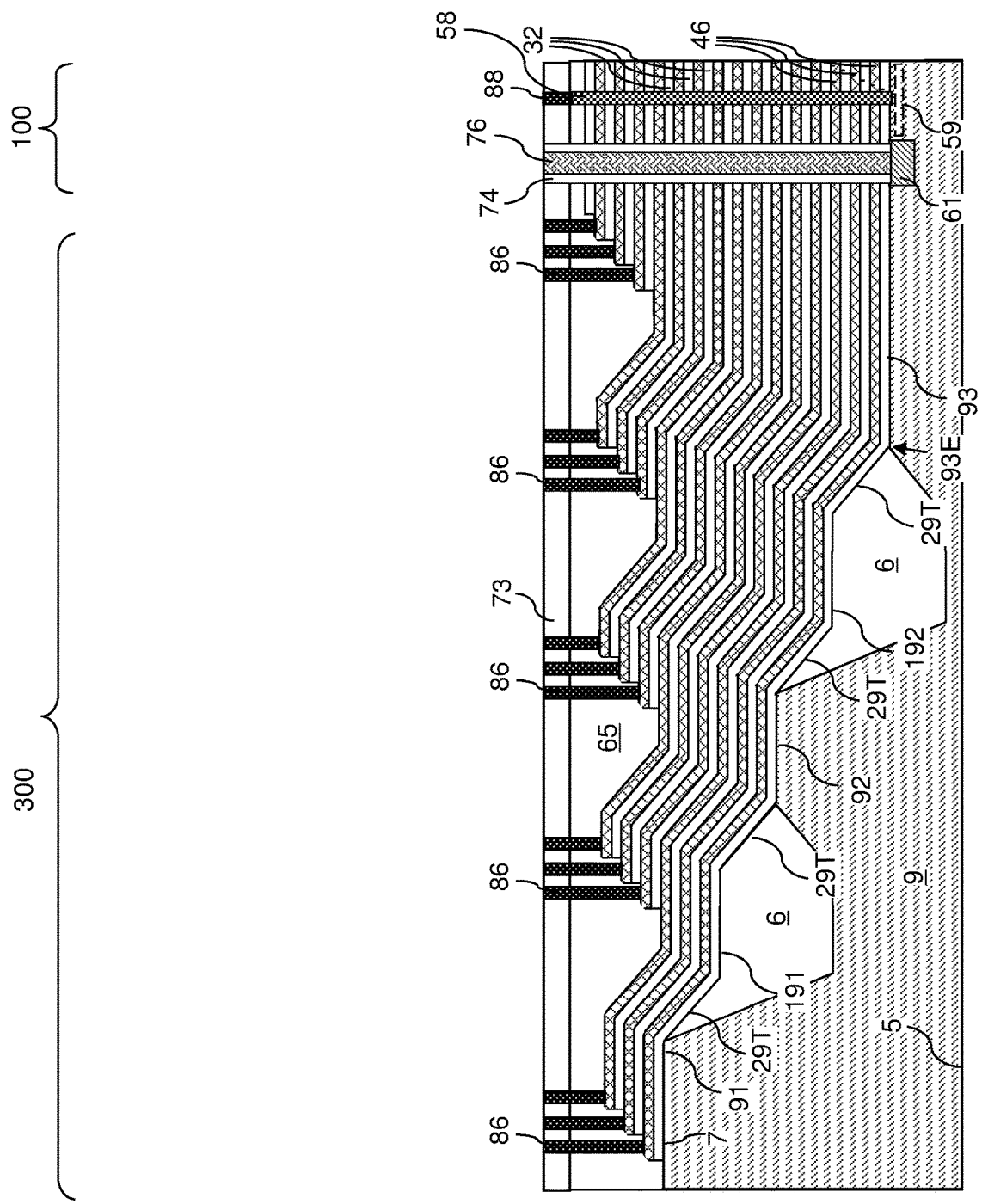
FIG. 28A is a schematic vertical cross-sectional view of the second exemplary structure after formation of word line contact via structures and array contact via structures according to the second embodiment of the present disclosure.
Figure 28B:
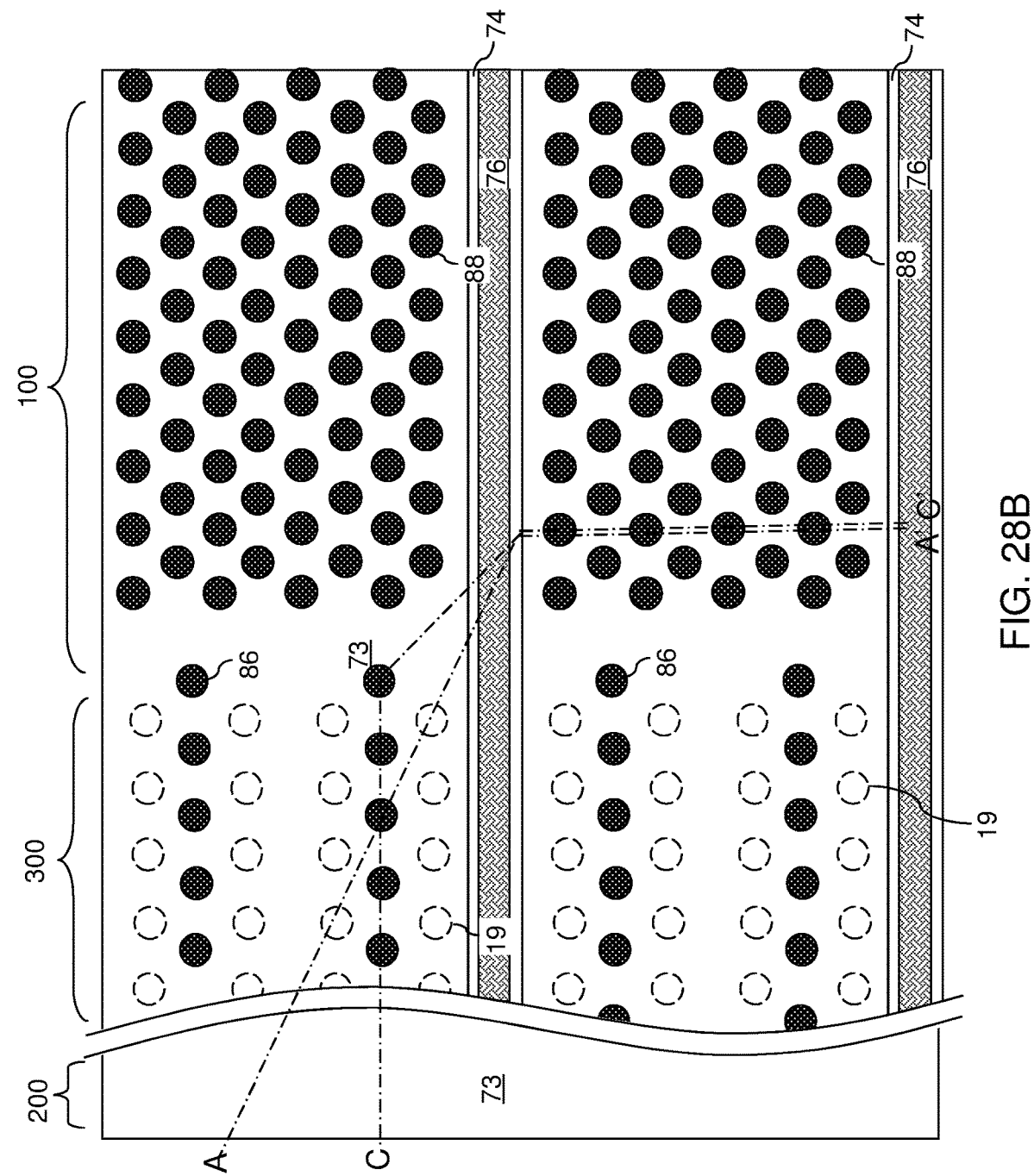
FIG. 28B is a top-down view of the second exemplary structure of FIG. 28A. The vertical plane A-A' is the plane of the schematic vertical cross-sectional view of FIG. 28A.
Figure 28C:
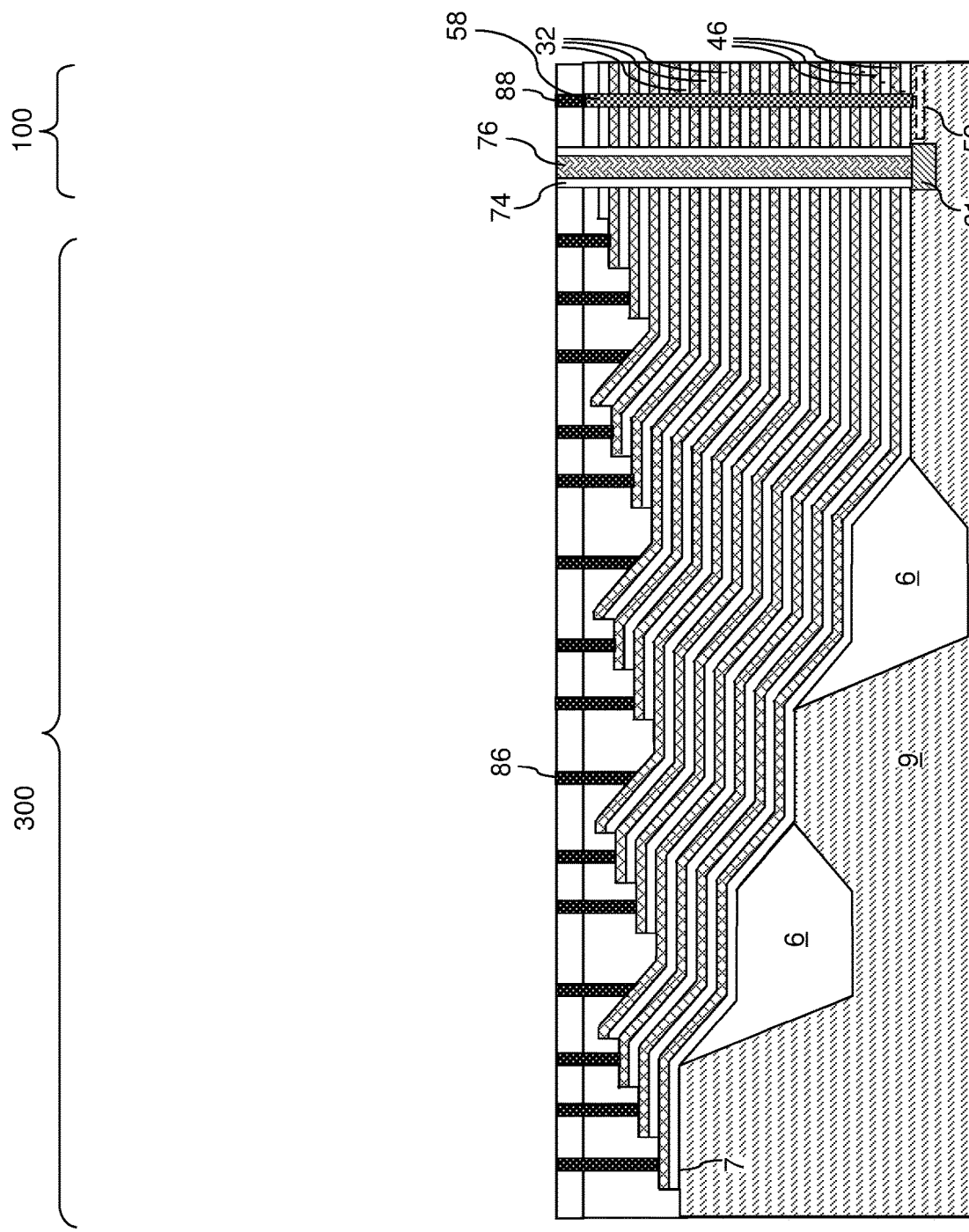
FIG. 28C is a schematic vertical cross-sectional view of the second exemplary structure along the vertical plane C-C' in FIG. 28B.

Referring to FIGS. 28A-28C, the processing steps of FIGS. 14A and 14B through the processing steps of FIGS. 21A-21C can be performed to form memory opening fill structures 58, support pillar structures 20, electrically conductive layers 46, source regions 61, insulating spacers 74, backside contact via structures 76, drain contact via structures 88, and word line contact via structures 86.

Referring to all drawings of the instant application, the various embodiments of the present disclosure provides a three-dimensional memory device, which comprises: a substrate including a plurality of vertically offset horizontal top surfaces {(91, 92, 93) or (91, 92, 93, 191, 192)}, wherein the plurality of top surfaces {(91, 92, 93) or (91, 92, 93, 191, 192)} includes a memory array region horizontal top surface 93 that is located in a memory array region 100 and is more proximal to a back side surface 5 of the substrate than any other of the plurality of horizontal top surfaces {(91, 92) or (91, 92, 191, 192)} located in the contact region 300; an alternating stack of insulating layers 32 and electrically conductive layers 46 located over the plurality of horizontal top surfaces {(91, 92, 93) or (91, 92, 93, 191, 192)} and including a plurality of staircase regions (30A, 30B, 30C, 30D, 30E), wherein each of the plurality of staircase regions (30A, 30B, 30C, 30D, 30E) is located over a respective one of the plurality of horizontal top surfaces {(91, 92, 93) or (91, 92, 93, 191, 192)}, and a respective subset of the electrically conductive layers 46 within each of the plurality of staircase regions (30A, 30B, 30C, 30D, 30E) has a lateral extent that decreases with a vertical distance from the back side surface 5; and memory stack structures 55 extending through the alternating stack (32, 46) and located in the memory array region 100, wherein each of the memory stack structures 55 comprises a memory film 50 and a vertical semiconductor channel 60 located within the memory film 50.

In one embodiment, the plurality of horizontal top surfaces {(91, 92, 93) or (91, 92, 93, 191, 192)} of the substrate are connected by a respective tapered sidewall (9T, 29T) of a substrate semiconductor layer 9 or of a silicon oxide portion 6 (which tapered surfaces of the substrate), and a respective subset of layers of the alternating stack (32, 46) overlie each of the at least one tapered sidewall (9T, 29T). In one embodiment, the plurality of horizontal top surfaces {(91, 92, 93) or (91, 92, 93, 191, 192)} comprises the memory array region horizontal top surface 93 and at least one plateau top surface (91, 92) that is located above a horizontal plane including the memory array region horizontal top surface 93.

In one embodiment, the at least one plateau top surface (91, 92, 93) comprises a plurality of plateau surfaces (91, 92); and a height of each of the plurality of plateau surfaces (91, 92, 93) from the horizontal plane including the memory array region horizontal top surface 93 increases with a lateral distance from an edge 93E of the memory array region horizontal top surface 93.

In one embodiment, a total number of layers within the alternating stack (32, 42) that overlie the respective tapered sidewall (9T, 29T) decreases with a lateral distance from an edge 93E of the memory array region horizontal top surface 100.

In one embodiment, each neighboring pair of staircase regions (30A, 30B, 30C, 30D, 30E) is connected by tapered surfaces of the alternating stack (32, 46) in the tapered layer region (31A, 31B) that are parallel to an underlying respective tapered sidewall (9T, 29T). Each electrically conductive layer 46 has horizontal portions in the staircase regions (30A, 30B, 30C, 30D, 30E) and tapered portions in the tapered layer regions (31A, 31B) of the contact region 300. Each electrically conductive layer has a horizontal strip shape substantially parallel to the memory array region horizontal top surface 93 in the memory array region 100.

In one embodiment, the substrate comprises a substrate semiconductor layer 9, and each of the plurality of horizontal top surfaces (91, 92, 93) is a top surface of the substrate semiconductor layer 9.

In one embodiment, the three-dimensional memory device comprises at least one semiconductor oxide portion 6 embedded within an upper portion of the substrate. At least one of the plurality of horizontal top surfaces (91, 92, 93, 192, 192) is a top surface of the substrate semiconductor layer 9, and at least another one of the plurality of horizontal top surfaces (91, 92, 93, 192, 192) is a top surface of the at least one semiconductor oxide portion 6.

In one embodiment, the three-dimensional memory device comprises support pillar structures 20 extending through the alternating stack (32, 46) in the plurality of staircase regions (30A, 30B, 30C, 30D, 30E) and into an upper portion of the substrate. Each of the support pillar structures 20 comprises a dummy memory film and a dummy semiconductor channel, the dummy memory film and the memory film 50 have a same layer composition, and the dummy semiconductor channel and the vertical semiconductor channel 60 have a same material composition. In one embodiment, the support pillar structures 20 can have bottom surfaces at surface regions of the substrate, and thus, can have different heights across the plurality of staircase regions (30A, 30B, 30C, 30D, 30E).

In one embodiment, the three-dimensional memory device can comprise a dielectric material portion 65 continuously overlying the plurality of staircase regions (30A, 30B, 30C, 30D, 30E), wherein the dielectric material portion 65 comprises: a plurality of retro-stepped bottom surfaces contacting a respective stepped surface in a respective one of the plurality of staircase regions (30A, 30B, 30C, 30D, 30E); and at least one tapered bottom surface contacting a respective tapered surface of the alternating stack (32, 46) and located between a neighboring pair of staircase regions (30A, 30B, 30C, 30D, 30E) among the plurality of staircase regions (30A, 30B, 30C, 30D, 30E).

In one embodiment, the three-dimensional memory device further comprises a set of contact via structures 86. Each of the electrically conductive layers 46 is contacted by a respective contact via structure 86 of the set of contact via structures 86 in the contact region 300. A total height variation within the set of contact via structures 86 is equal to, or less than, one half of an entire height of the alternating stack (32, 46), and may be equal to, or less than, 1/n of the entire height of the alternating stack (32, 46).

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 9 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having horizontal and tapered portions in the contact region 300 and having a horizontal strip shape substantially parallel to the top surface of the substrate 9 in the memory array region 100. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate 9 and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The methods of the present disclosure can be employed to provide a three-dimensional memory device in which the height difference between the top and bottom electrically conductive layer (e.g., word line) 46 in the respective staircase regions (30A, 30B, 30C) in the contact region is reduced. Therefore, a height variation of the word line contact via structures 86 is about 1/n times the total height of the alternating stack (32, 46), in which n is the total number of staircase regions. Thus, overetch or underetch of contact via cavities for forming the word line contact via structures 86 can be minimized due to a reduction in the total height variation within the set of contact via cavities. Thus, the methods of the present disclosure can reduce or prevent electrical shorts between vertically neighboring pairs of electrically conductive layers 46 by word line contact via structures 86 and electrical opens between word line contact via structures 86 and the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;
an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface; and
memory stack structures extending through the alternating stack and located in the memory array region, wherein each of the memory stack structures comprises a memory film and a vertical semiconductor channel located within the memory film;
wherein the plurality of horizontal top surfaces of the substrate are connected by a respective tapered sidewall, and a respective subset of layers of the alternating stack overlie each of the at least one tapered sidewall;
wherein the plurality of horizontal top surfaces comprises the memory array region horizontal top surface and at least one plateau top surface that is located above a horizontal plane including the memory array region horizontal top surface;
wherein:
the at least one plateau top surface comprises a plurality of plateau surfaces; and
a height of each of the plurality of plateau surfaces from the horizontal plane including the memory array region horizontal top surface increases with a lateral distance from an edge of the memory array region horizontal top surface.

2. A three-dimensional memory device comprising:
a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;
an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface; and
memory stack structures extending through the alternating stack and located in the memory array region, wherein each of the memory stack structures comprises a memory film and a vertical semiconductor channel located within the memory film;

wherein the plurality of horizontal top surfaces of the substrate are connected by a respective tapered sidewall, and a respective subset of layers of the alternating stack overlie each of the at least one tapered sidewall;

wherein the plurality of horizontal top surfaces comprises the memory array region horizontal top surface and at least one plateau top surface that is located above a horizontal plane including the memory array region horizontal top surface; and wherein a total number of layers within the alternating stack that overlie the respective tapered sidewall decreases with a lateral distance from an edge of the memory array region horizontal top surface.

3. A three-dimensional memory device comprising:

a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;

an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface; and memory stack structures extending through the alternating stack and located in the memory array region, wherein each of the memory stack structures comprises a memory film and a vertical semiconductor channel located within the memory film;

wherein the plurality of horizontal top surfaces of the substrate are connected by a respective tapered sidewall, and a respective subset of layers of the alternating stack overlie each of the at least one tapered sidewall;

wherein:

each neighboring pair of staircase regions is connected by tapered surfaces of the alternating stack that are parallel to the underlying respective tapered sidewall; and each electrically conductive layer has horizontal and tapered portions in the contact region and has a horizontal strip shape substantially parallel to the memory array region horizontal top surface in the memory array region.

4. A three-dimensional memory device comprising:

a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;

an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface;

memory stack structures extending through the alternating stack and located in the memory array region, wherein each of the memory stack structures comprises a memory film and a vertical semiconductor channel located within the memory film; and support pillar structures extending through the alternating stack in the plurality of staircase regions and into an upper portion of the substrate, wherein:

each of the support pillar structures comprises a dummy memory film and a dummy semiconductor channel;

the dummy memory film and the memory film have a same layer composition; and the dummy semiconductor channel and the semiconductor channel have a same material composition.

5. The three-dimensional memory device of claim 4, wherein the support pillar structures have different heights across the plurality of staircase regions.

6. A three-dimensional memory device comprising:

a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;

an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface;

memory stack structures extending through the alternating stack and located in the memory array region, wherein each of the memory stack structures comprises a memory film and a vertical semiconductor channel located within the memory film; and a dielectric material portion continuously overlying the plurality of staircase regions, wherein the dielectric material portion comprises:

a plurality of retro-stepped bottom surfaces contacting a respective stepped surface in a respective one of the plurality of staircase regions; and at least one tapered bottom surface contacting a respective tapered surface of the alternating stack and located between a neighboring pair of staircase regions among the plurality of staircase regions.

7. A three-dimensional memory device comprising:
a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;
an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface;
memory stack structures extending through the alternating stack and located in the memory array region, wherein each of the memory stack structures comprises a memory film and a vertical semiconductor channel located within the memory film; and
a set of contact via structures, wherein:
each of the electrically conductive layers is contacted by a respective contact via structures of the set of contact via structures in the contact region; and
a total height variation within the set of contact via structures is equal to, or less than, one half of an entire height of the alternating stack.

8. A three-dimensional memory device comprising:
a substrate including a plurality of horizontal top surfaces that are vertically offset among one another and further including a back side surface located on an opposite side of the plurality of horizontal top surfaces, wherein the plurality of horizontal top surfaces includes a memory array region horizontal top surface that is located in a memory array region and is more proximal to the back side surface of the substrate than any other of the plurality of horizontal top surfaces located in a contact region;
an alternating stack of insulating layers and electrically conductive layers located over the plurality of horizontal top surfaces and including a plurality of staircase regions, wherein each of the plurality of staircase regions is located over a respective one of the plurality of horizontal top surfaces, and a respective subset of the electrically conductive layers within each of the plurality of staircase regions has a lateral extent that decreases with a vertical distance from the back side surface; and
memory stack structures extending through the alternating stack and located in the memory array region, wherein each of the memory stack structures comprises a memory film and a vertical semiconductor channel located within the memory film;
wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a horizontal strip shape extending substantially parallel to the top surface of the substrate in the memory array region, the plurality of control gate electrodes comprise at least a first control gate electrode located in the first device level and a second control gate electrode located in the second device level; and
the array of monolithic three-dimensional NAND strings comprises:
a plurality of semiconductor channels located within the memory stack structures, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *